United States Patent [19]
Nomura et al.

[11] Patent Number: 5,826,126
[45] Date of Patent: *Oct. 20, 1998

[54] FLEXIBLE PRINTED CIRCUIT BOARD HOUSING STRUCTURE FOR A CAMERA

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 777,481

[22] Filed: Dec. 30, 1996

[30] Foreign Application Priority Data

Jan. 26, 1996 [JP] Japan ................................ 8-012317
Feb. 16, 1996 [JP] Japan ................................ 8-029486
Feb. 16, 1996 [JP] Japan ................................ 8-029487

[51] Int. Cl.$^6$ .................................................. G03B 17/02
[52] U.S. Cl. ............................................................ 396/542
[58] Field of Search ............................... 396/72, 76, 529, 396/535, 542

[56] References Cited

U.S. PATENT DOCUMENTS

| | | |
|---|---|---|
| 3,817,601 | 6/1974 | Colaiace et al. . |
| 4,536,068 | 8/1985 | Kodaira . |
| 4,621,914 | 11/1986 | Taniguchi et al. . |
| 4,711,548 | 12/1987 | Arakawa et al. . |
| 5,051,764 | 9/1991 | Nomura . |
| 5,079,577 | 1/1992 | Nomura . |
| 5,162,831 | 11/1992 | Haraguchi et al. . |
| 5,198,932 | 3/1993 | Takamura . |
| 5,327,184 | 7/1994 | Nomura et al. . |
| 5,371,569 | 12/1994 | Tanaka . |
| 5,398,163 | 3/1995 | Sano . |
| 5,581,412 | 12/1996 | Tanaka . |

FOREIGN PATENT DOCUMENTS

| | | |
|---|---|---|
| 3219221 | 9/1991 | Japan . |
| 2231974 | 11/1990 | United Kingdom . |
| 2244567 | 12/1991 | United Kingdom . |

*Primary Examiner*—Howard B. Blankenship
*Attorney, Agent, or Firm*—Greenblum & Bernstein, P.L.C.

[57] ABSTRACT

A flexible printed circuit board housing structure for a lens barrel of a camera as applied to a camera that includes a control unit, a film chamber, a stationary barrel, a movable barrel, and a flexible printed circuit board. The movable barrel is supported on the stationary barrel in a manner enabling movement in the optical axis direction. The movable barrel houses a shutter unit and the flexible printed circuit board is connected between the shutter unit and the control unit. The flexible printed circuit board housing structure includes an FPC housing space, an FPC relief hole, and a spring. The FPC housing space is formed between the stationary barrel and a substantially cylindrical outer face of the film chamber and is provided with the spring. The FPC relief hole is formed in the stationary barrel and passes through the stationary barrel to the FPC housing space. The spring applies an urging force to urge the flexible printed circuit board into the FPC housing space through the FPC relief hole.

19 Claims, 20 Drawing Sheets

FLEXIBLE PRINTED CIRCUIT BOARD HOUSING STRUCTURE FOR A CAMERA

BACKGROUND OF THE INVENTION

1. Field of the Invention

The present invention relates to a flexible printed circuit board housing structure for a camera.

2. Background and Material Information

A camera that is provided with a movable barrel conventionally includes a flexible printed circuit board (FPC) to electrically connect electrical units, such as a shutter or the like, on the movable barrel to a control unit on the camera such that control signals can be transmitted and received.

As the movable barrel moves, the flexible printed circuit board will sometimes be slack, in which case, the flexible printed circuit board may interfere with the movement of the movable barrel or with the light passing through the camera aperture.

In order to avoid the problems caused by the slacking of the flexible printed circuit board, a housing structure in which the slack in the flexible printed circuit board is taken up or paid out can be provided on the movable barrel or on the camera body. However, methods of taking up and paying out the slack in the flexible printed circuit board are typically complicated and require a large number of additional components. Further, the provision of such a housing structure makes the size of the movable barrel or the camera larger.

SUMMARY OF THE INVENTION

It is therefore an object of the present invention to provide an improved flexible printed circuit board guiding structure that is small and has a simple arrangement.

According to one aspect of the present invention, there is provided a flexible printed circuit board housing structure for a camera. In particular, the camera includes a movable barrel and a flexible printed circuit board. The movable barrel is movable along the optical axis of the camera and the flexible printed circuit board is connected between an electrical unit on the movable barrel and a control unit on the camera.

The flexible printed circuit board housing structure includes an FPC housing space and a spring mechanism.

The FPC housing space is formed on the camera for storage of the flexible printed circuit board.

The spring mechanism is provided in the FPC housing space such that the spring mechanism applies an urging force to urge the flexible printed circuit board into the FPC housing space.

Preferably, the spring mechanism urges the flexible printed circuit board in a direction perpendicular to the optical axis of the camera.

In a particular case, an end of the flexible printed circuit board may be fixed to the FPC housing space, and a slot, which has a predetermined length, may be formed lengthwise on a part of the flexible printed circuit board that is located inside the FPC housing space near to the fixed end of the flexible printed circuit board. Further, the spring mechanism may include a spring bearing pin that is movably fitted into the slot, and the urging force of the spring mechanism is applied to the flexible printed circuit board via the spring bearing pin.

With the above arrangement, the flexible printed circuit board is urged into the FPC housing space using a simple spring mechanism. Further, since the spring urges the flexible printed circuit board perpendicular to the optical axis and the action of the spring mechanism acts on the lengthwise slot on the flexible printed circuit board, the range of movement of the spring mechanism is small in relation to the amount of flexible printed circuit board urged into the FPC housing space such that less space is required for the spring mechanism.

Also, the FPC housing preferably is formed to include a curved surface which is positioned such that as the spring mechanism urges the flexible printed circuit board into the FPC housing space, the flexible printed circuit board curves around the curved surface. Using a curved surface to curve the flexible printed circuit board allows for a greater length of the printed circuit board to be urged into the FPC housing space then if the flexible printed circuit board were straight.

According to another aspect of the present invention, the flexible printed circuit board housing structure may be applied to a camera that includes a control unit, a film chamber, a camera aperture, a stationary barrel, a movable barrel, and a flexible printed circuit board.

The stationary barrel is positioned in front of the camera aperture and the movable barrel is supported on the stationary barrel in a manner enabling movement in the optical axis direction. The movable barrel houses an electrical unit and the flexible printed circuit board is connected between the electrical unit and the control unit.

In this case, the flexible printed circuit board housing structure includes an FPC housing space and an FPC relief hole.

The FPC housing space may be formed between the stationary barrel and a substantially cylindrical outer face of the film chamber and the FPC relief hole may be formed in the stationary barrel to pass through the stationary barrel to the FPC housing space.

In particular, the flexible printed circuit board may be lead via the FPC relief hole to the FPC housing space.

In this aspect of the invention, the term "film chamber" may represent, for example, a cartridge chamber for storing unexposed film or as a wind-up chamber for storing exposed film.

In this way, the FPC housing space may be formed in otherwise unused space, that is, the space between the substantially cylindrical outer face of the film chamber and the stationary barrel, so that the size of the camera is not increased in providing the FPC housing space.

Preferably, the FPC relief hole is formed at a position which is a middle point of the range of movement of the movable barrel. This arrangement ensures that slack in the flexible printed circuit board is adequately taken up without undue stress on the flexible printed circuit board.

Further, the FPC housing space is provided with a spring mechanism that applies an urging force to urge the flexible printed circuit board into the FPC housing space.

As noted above, preferably, the spring mechanism urges the flexible printed circuit board in a direction perpendicular to the optical axis of said camera.

Also, as noted above, in a particular case, an end of the flexible printed circuit board is fixed to the FPC housing space, and a slot, which is a predetermined length, is formed lengthwise on a part of the flexible printed circuit board that is located inside the FPC housing space near to the fixed end of the flexible printed circuit board. Further, the spring mechanism includes a spring bearing pin that is movably fitted into the slot and the urging force of the spring mechanism is applied to the flexible printed circuit board via the spring bearing pin.

DETAILED DESCRIPTION OF THE PREFERRED EMBODIMENTS

An embodiment of a flexible printed circuit board housing structure is applied to a lens-shutter type zoom lens camera.

Figure 11:
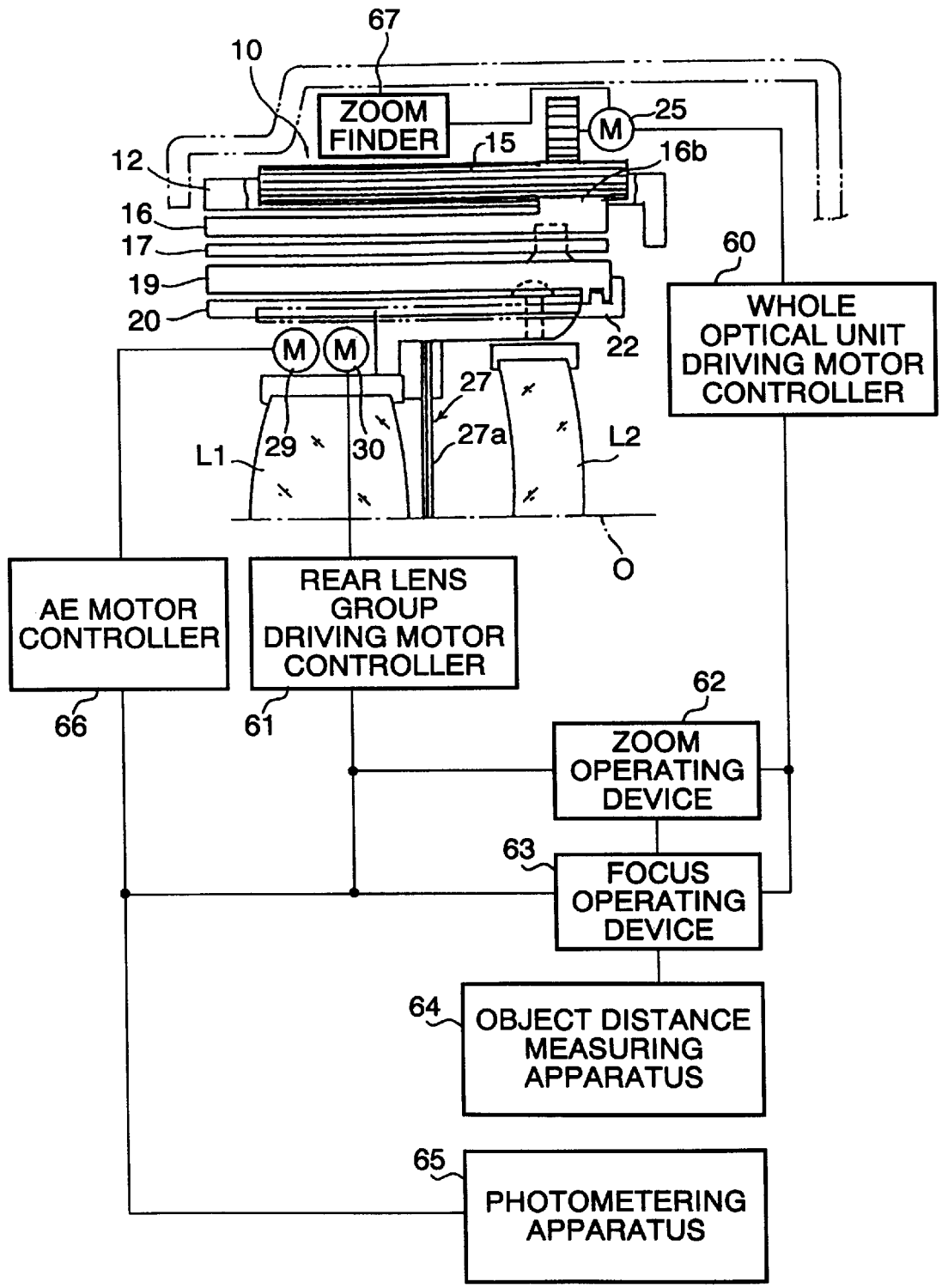
FIG. 11 is a block diagram of a controlling system for controlling an operation of the zoom lens barrel.

The concept of the zoom lens camera will now be described with reference to FIG. 11. FIG. 11 is a schematic representation of various elements which comprise a zoom lens camera.

The zoom lens camera is provided with a three-stage delivery-type zoom lens barrel 10 having three movable barrels, namely a first movable barrel 20, a second movable barrel 19 and a third movable barrel 16, which are concentrically arranged in this order from an optical axis 0. In the zoom lens barrel 10, two lens groups are provided, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operative device 62 may comprise as, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, set by the operation of the zoom operating device 62, may be indicated as a value on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. The driving of the whole optical unit driving motor controller 60 and the rear lens group driving motor controller 61, moves the front and rear lens groups L1 and L2 to respective positions corresponding to a set focal length and a detected object distance, such that the zoom lens is focused on the object.

Specifically, the focus operating device 63 is provided with a release button (not shown) provided on an upper wall of the camera body. A photometering switch and a release switch (both not shown) are synchronized with the release button. When the release button is half-depressed (half-step), the photometering switch is turned ON, and the object distance measuring and photometering commands are respectively input to the object distance measuring apparatus 64 and the photometering apparatus 65.

When the release button is fully depressed (full step), the release switch is turned ON, and according to the result of object distance measuring command and a set focal length, the whole optical unit driving motor 25 and the rear lens group driving motor 30 are driven. In addition, the focusing operation, in which the front lens group L1 and the rear lens group L2 move to the focusing position, is executed. Further, an AE motor 29 of an AF/AE (i.e., autofocus/autoexposure) shutter unit (FIG. 9) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole along the optical axis 0 (optical axis direction). Simultaneous with such a movement, the rear lens group driving motor 30 may also be driven via the rear lens group driving motor controller 61 to move the rear lens group L2 relatively with respect to the first lens group L1. However, this above-described operation is not performed under the conventional concept of zooming, in which the focal length is varied sequentially while maintaining an in-focus condition. When the zoom operating device 62 is operated, the front lens group L1 and the rear lens group L2 move in the optical axis direction, without varying the distance therebetween, by driving only the whole optical unit driving motor 25.

During the zooming operation, an in-focus condition cannot be maintained at all times with respect to an object located at a specific distance. However, this is not a problem in a lens-shutter type camera, since the image of the object is not observed through the photographing optical system, but rather through the finder optical system, that is provided separate from the photographing optical system. Thus, it is sufficient that the in-focus condition is obtained when the shutter is released. Accordingly, when the release button is fully depressed, the focusing operation (focus adjusting operation) is carried out by moving at least one of the whole optical unit driving motor 25 and the rear lens group driving motor 30. In such a manner, when the focus operating device 63 is operated and since each of the two lens groups L1, L2 can be driven independently, the position of the lens groups L1, L2 can be flexibly controlled.

An embodiment of the zoom lens barrel according to the above concept will be described with reference to mainly FIGS. 9 and 10.

The overall structure of the zoom lens barrel 10 will now be described.

The zoom lens barrel 10 is provided with the first movable barrel 20, the second movable barrel 19, the third movable barrel 16, and a fixed lens barrel block 12. The third movable barrel 16 engages a cylindrical portion 12p of the fixed lens barrel block 12, and moves along the optical axis 0 upon being rotated. A linear guide barrel 17 is provided on an inner periphery of the third movable barrel 16 which is rotationally restricted. The linear guide barrel 17 and the third movable barrel 16 move together as a whole along the optical axis 0, with the third movable barrel 16 rotating relative to the linear guide barrel 17. The first movable barrel 20 moves along the optical axis 0 and is rotationally restricted. The second movable barrel 19 rotatably moves relative to the linear guide barrel 17 and the first movable barrel 20 along the optical axis 0. The whole optical unit driving motor 25 is secured to the fixed lens barrel block 12. A shutter mounting stage 40 is secured to the first movable barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

The fixed lens barrel block 12 is fixed in front of an aperture plate 14 fixed to the camera body. The aperture plate 14 is provided on a center thereof with a rectangular-shaped aperture 14a which forms the limits of each exposed frame. The fixed lens barrel block 12 is provided, on an inner periphery of the cylindrical portion 12p thereof, with a female helicoid 12a, and also a plurality of linear guide grooves 12b each extending parallel to the optical axis 0, i.e., extending in the optical axis direction. At the bottom of one of the linear guide grooves 12b, namely 12b', a code plate 13a, having a predetermined code pattern, is fixed. The code plate 13a extends in the optical axis direction and extends substantially along the whole of the length of the fixed lens barrel block 12. The code plate 13a is part of a flexible printed circuit board 13 positioned outside the fixed lens barrel block 12.

Figure 7:
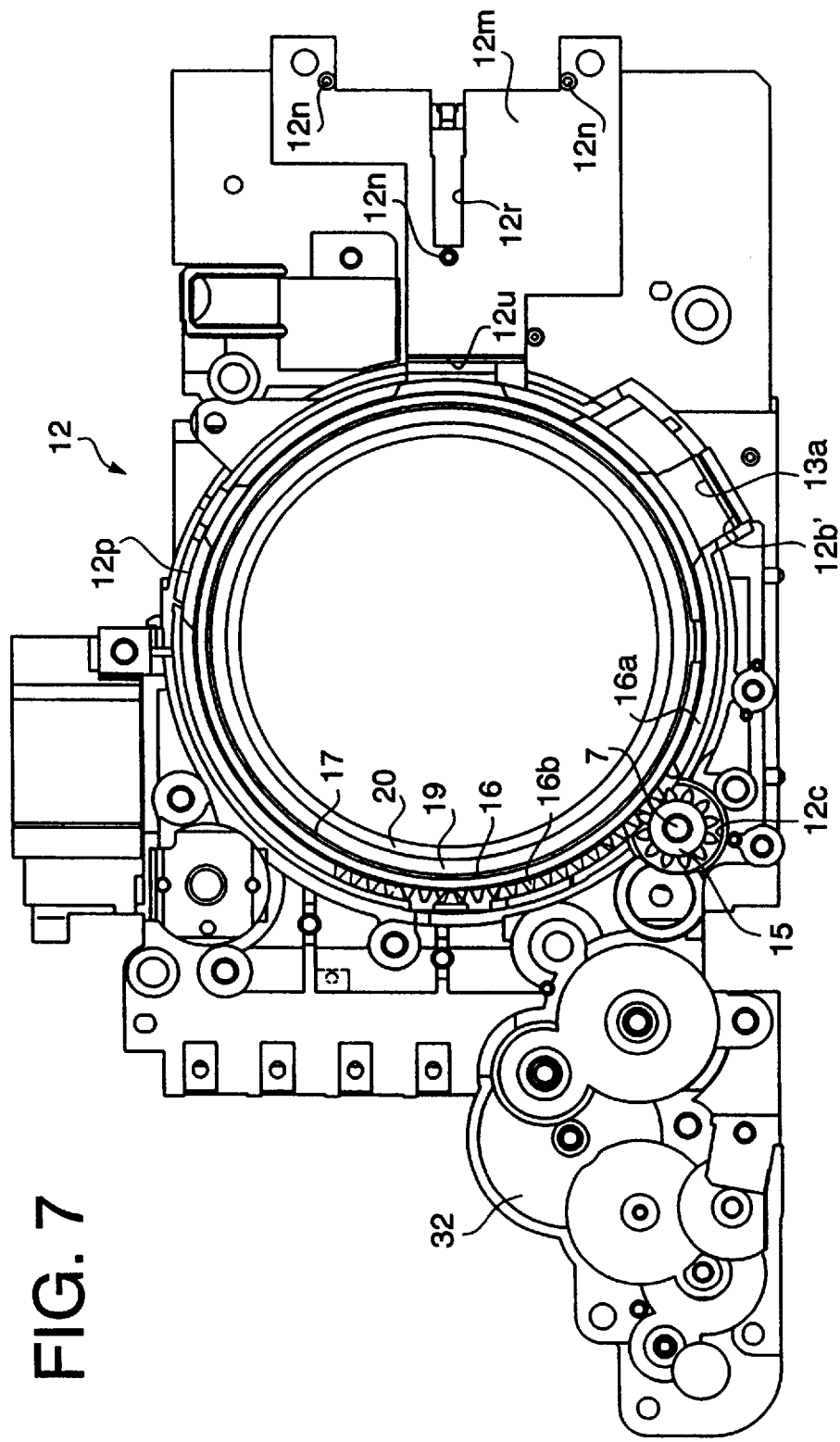
FIG. 7 is a front elevational view of a fixed lens barrel block of the zoom lens barrel.
Figure 10:
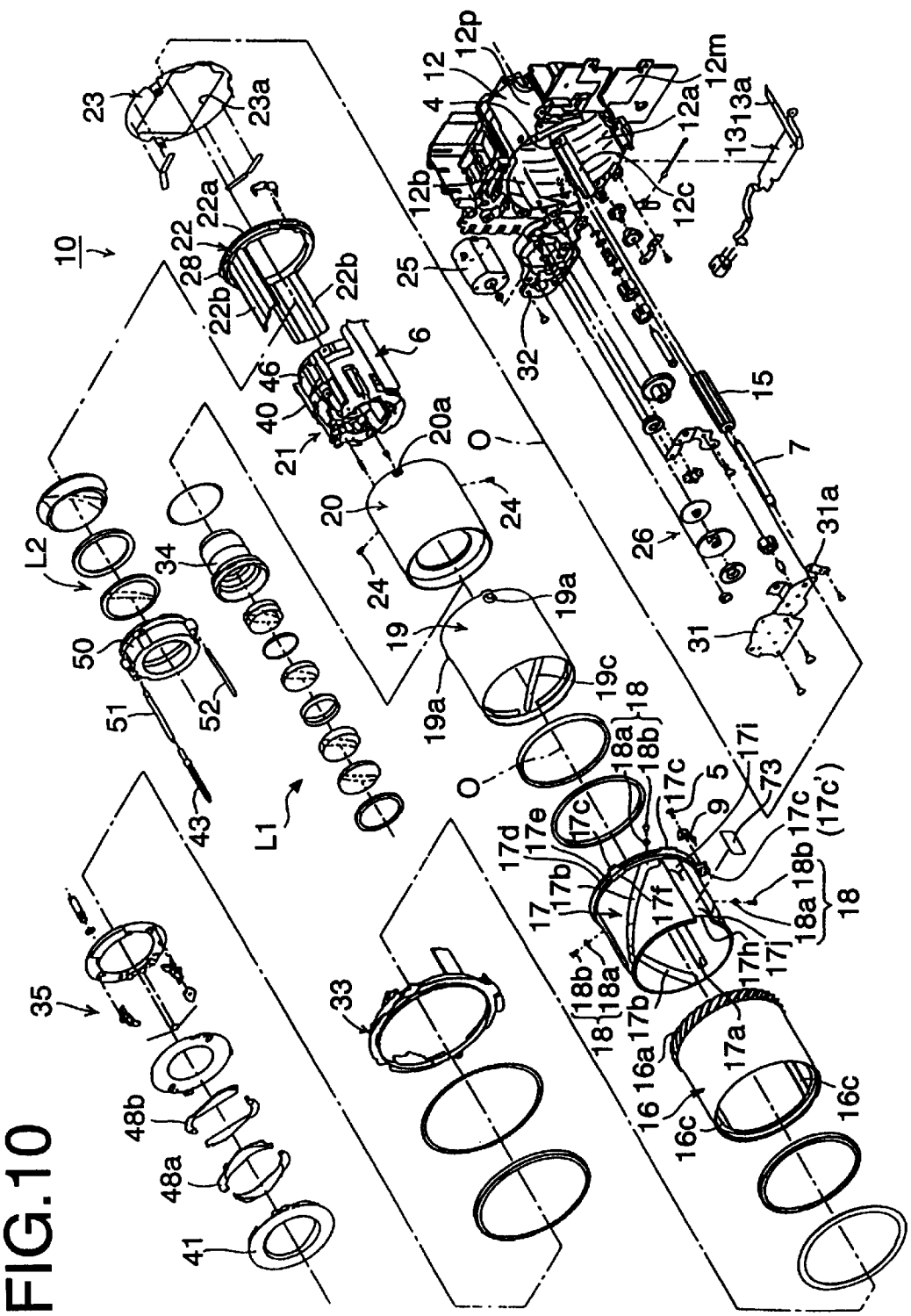
FIG. 10 is an exploded perspective view of the overall structure of the zoom lens barrel.

A gear housing 12c is provided as shown in FIG. 7 or 10 in the fixed lens barrel block 12. The gear housing 12c is recessed outwardly from an inner periphery of the cylindrical portion 12p of the fixed lens barrel block 12 in a radial direction while extending in the optical axis direction. In the gear housing 12c, a driving pinion 15, extending in the optical axis direction, is rotatably positioned. Both ends of an axial shaft 7 of the driving pinion 15 are rotatably supported by a supporting hollow 4, which is provided in the fixed lens barrel block 12, and a supporting hollow 31a, which is provided on a gear supporting plate 31 fixed on the fixed lens barrel block 12 by set screws (not shown), respectively. Part of the teeth of the driving pinion 15 project inwardly from the inner periphery of the cylindrical portion of the fixed lens barrel block 12, so that the driving pinion 15 meshes with an outer peripheral gear 16b of the third movable barrel 16, as shown in FIG. 7.

Figure 6:
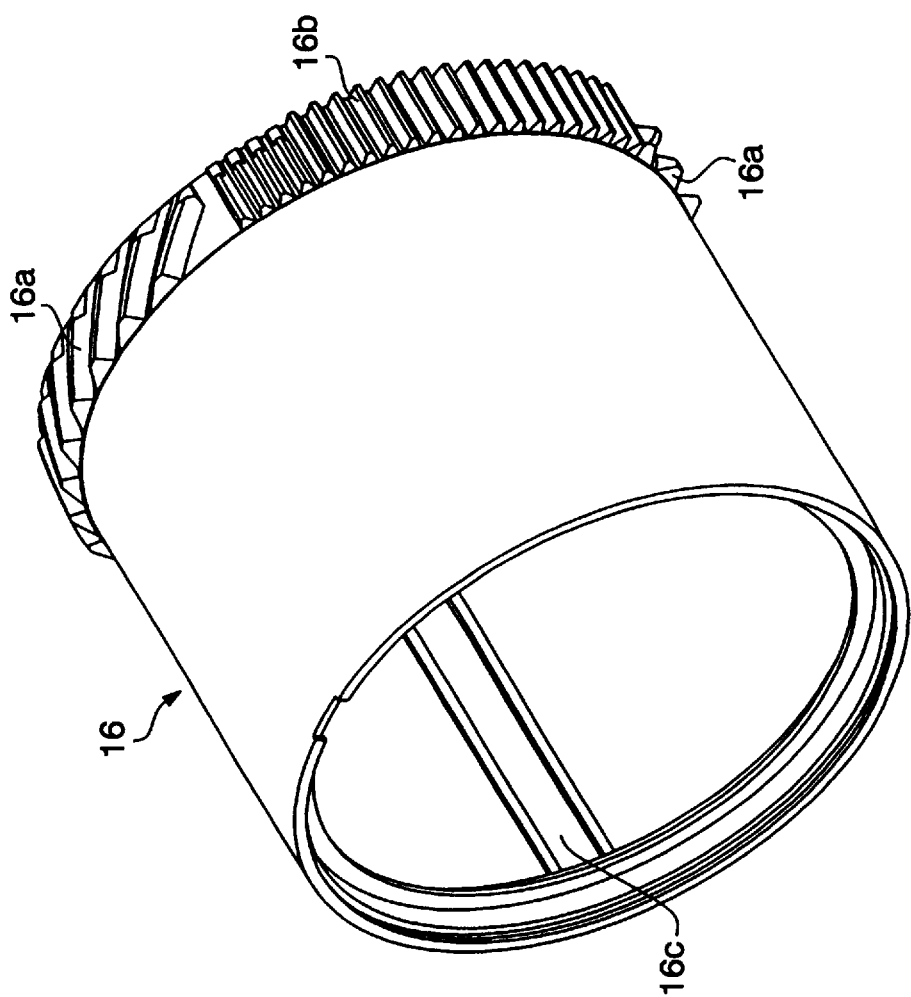
FIG. 6 is an external schematic perspective view of a third movable barrel of the zoom lens barrel.

A plurality of linear guide grooves 16c are formed on an inner periphery of the third movable barrel 16, each of which extends parallel to the optical axis 0. At an outer periphery of the rear end of the third movable barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to engage with the outer peripheral gear 16b throughout the entire range of movement of the third movable barrel 16 in the optical axis direction.

As shown in FIG. 10, the linear guide barrel 17 is provided with a rear end flange 17d on a rear part of an outer periphery. The rear end flange 17d has a plurality of engaging projections 17c each projecting away from the optical axis 0 in a radial direction. The linear guide barrel 17 is further provided with an anti-dropping flange 17e in front of the rear end flange 17d. A circumferential groove 17g is formed between the rear end flange 17d and the anti-dropping flange 17e. The anti-dropping flange 17e has a radius which is smaller than the rear end flange 17d. The anti-dropping flange 17e is provided with a plurality of cutout portions 17f. Each of the cutout portions 17f allows a corresponding engaging projection 16d to be inserted into the circumferential groove 17g, as shown in FIG. 9.

The third movable barrel 16 is provided with a plurality of engaging projections 16d on an inner periphery of the rear end thereof. Each of the engaging projections 16d projects towards the optical axis 0 in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 9). By rotating the third movable barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed on the rear end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis 0.

A contacting terminal 9 is fixed to one of the engaging projections 17c, in particular projection 17c'. The contacting terminal 9 is in slidable contact with the code plate 13a, fixed to the bottom of the linear guide groove 12b', to generate signals corresponding to focal length information during zooming.

On the inner periphery of the linear guide barrel 17 a plurality of linear guide grooves 17a are formed, each extending parallel to the optical axis 0. A plurality of lead slots 17b are also formed on the linear guide barrel 17 as shown in FIG. 10. The lead slots 17b are each formed oblique (inclined) to the optical axis 0.

The second movable barrel 19 engages with the inner periphery of the linear guide barrel 17. A plurality of lead grooves 19c are provided on the inner periphery of the second movable barrel 19, in a direction inclined oppositely to the lead slots 17b. A plurality of follower projections 19a are provided on the outer periphery of the rear end of the second movable barrel 19. Each of the follower projections 19a has a trapezoidal cross-sectional shape projecting away from the optical axis 0 in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third movable barrel 16. With such an arrangement, when the third movable barrel 16 rotates, the second movable barrel 19 rotates while moving linearly in the optical axis direction.

The first movable barrel 20 is engaged to the inner periphery of the second movable barrel 19. A plurality of follower pins 24 are provided on an outer periphery of the rear of the first movable barrel 20, each engaging with the corresponding inner lead groove 19c. In addition, the first movable barrel 20 is guided linearly by a linear guide member 22. The first movable barrel 20 is provided at the front end thereof with a decorative plate 41.

Figure 1:
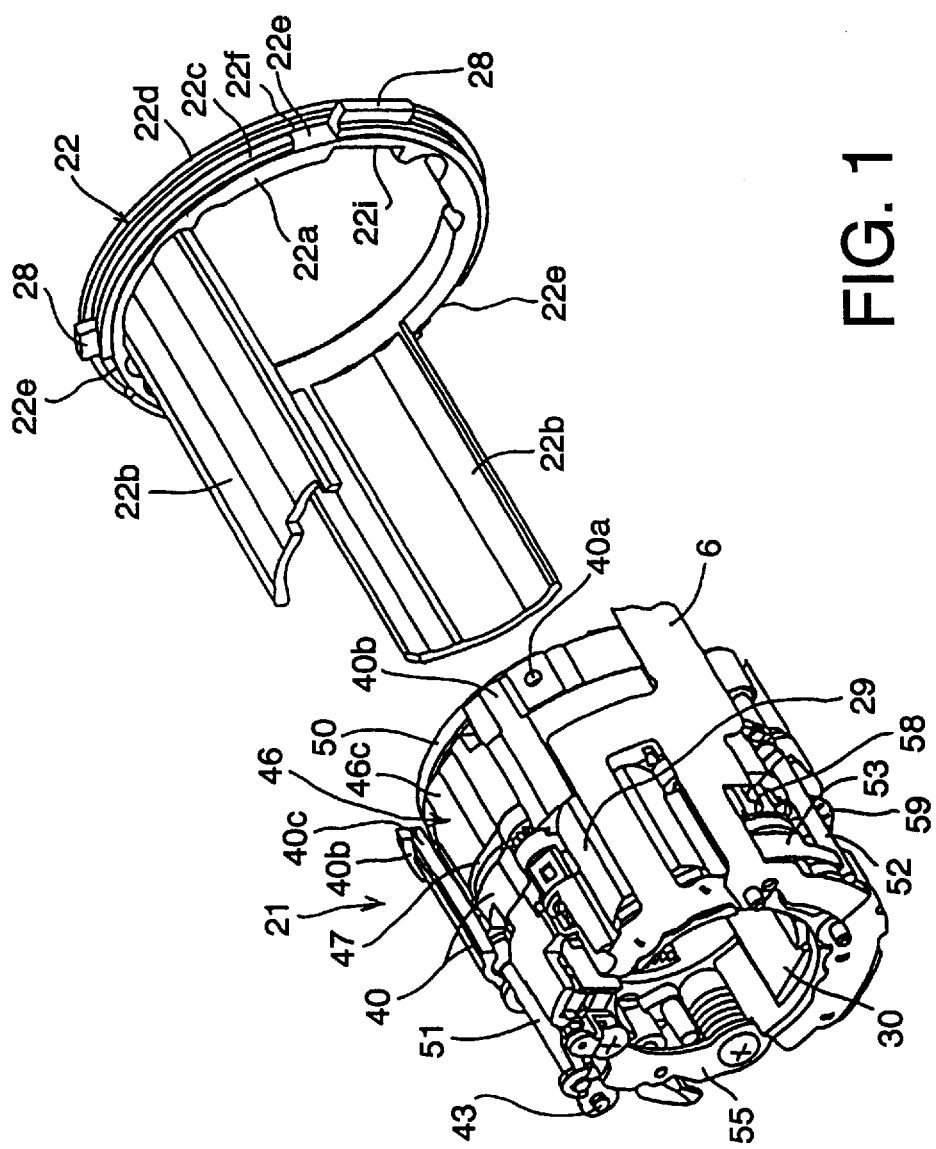
FIG. 1 is an enlarged schematic perspective view showing a part of a zoom lens barrel.
Figure 2:
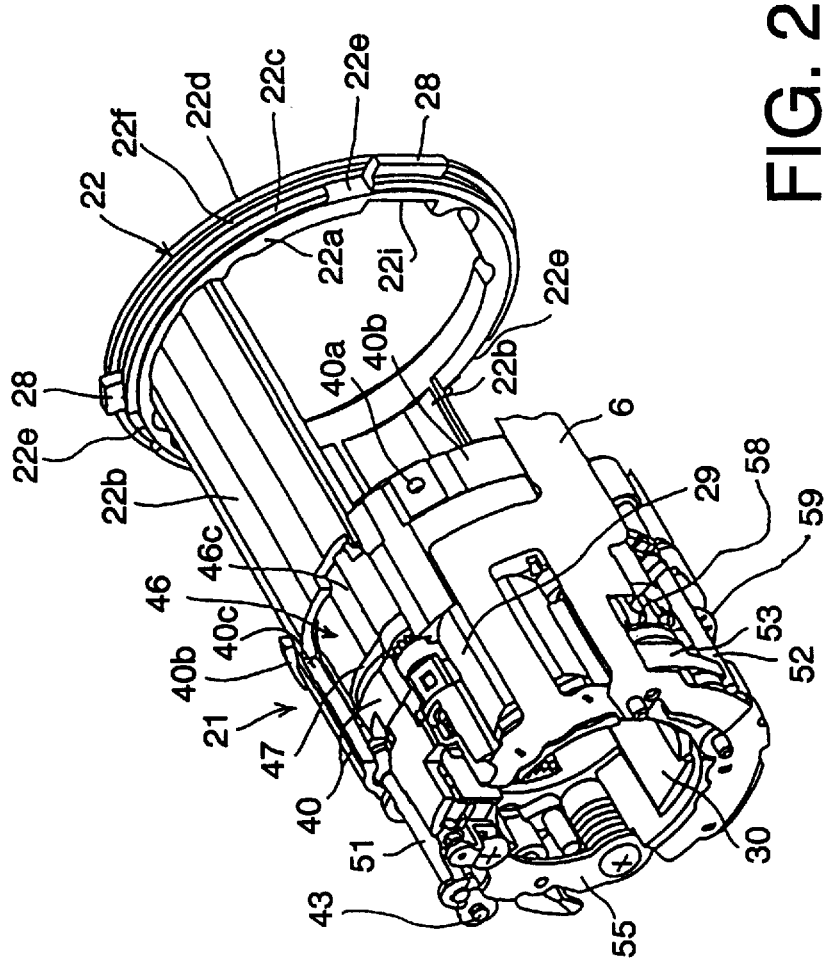
FIG. 2 is a schematic perspective view showing the part of the zoom lens barrel shown in FIG. 1 in an engaged state.
Figure 3:
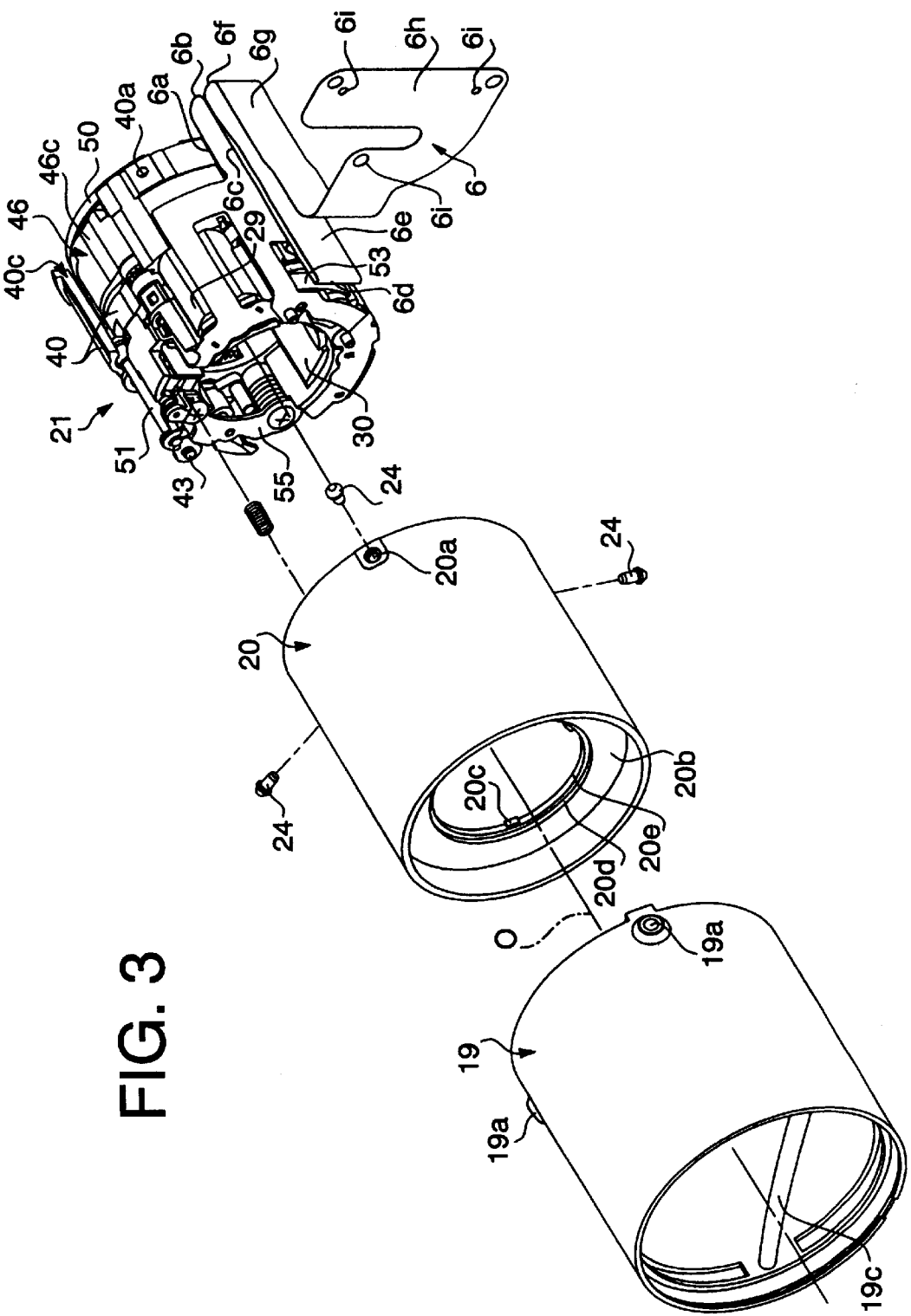
FIG. 3 is an enlarged exploded perspective view showing a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis 0 in a radial direction. The engaging projections 28 slidably engage with the linear guide grooves 17a. The guide legs 22b are respectively inserted into linear guides 40c between the inner peripheral surface of the first movable barrel 20 and the AF/AE shutter unit 21.

The annular member 22a of the linear guide member 22 is connected to the rear of the second movable barrel 19, such that the linear guide member 22 and the second movable barrel 19 move along the optical axis 0 as a whole, and in addition are capable of relatively rotating with respect to each other around the optical axis 0. The linear guide member 22 is further provided, on the outer periphery of the rear end thereof, with a rear end flange 22d. The linear guide member 22 is also provided with an anti-dropping flange 22c in front of the rear end flange 22d. A circumferential groove 22f is formed between the rear end flange 22d and the anti-dropping flange 22c. The anti-dropping flange 22c has a radius which is smaller than the rear end flange 22d. As shown in FIG. 1 or 2, the anti-dropping flange 22c is provided with a plurality of cutout portions 22e, each allowing a corresponding engaging projection 19b to be inserted into the circumferential groove 22f (see FIG. 9).

A plurality of engaging projections 19b, each projecting towards the optical axis 0 in a radial direction are provided on an inner periphery of the rear end of the second movable barrel 19. By inserting the engaging projections 19b into the circumferential groove 22f through the corresponding cutout portions 22e, the engaging projections 19b are positioned in the circumferential groove 22f between the flanges 22c and 22d. By rotating the second movable barrel 19 relative to the linear guide member 22, the engaging projections 19b are engaged with the linear guide member 22. With the above structure, when the second movable barrel 19 rotates in the forward or reverse rotational direction, the first movable barrel 20 moves linearly, forwardly or rearwardly along the optical axis 0, but is restricted from rotating.

Figure 8:
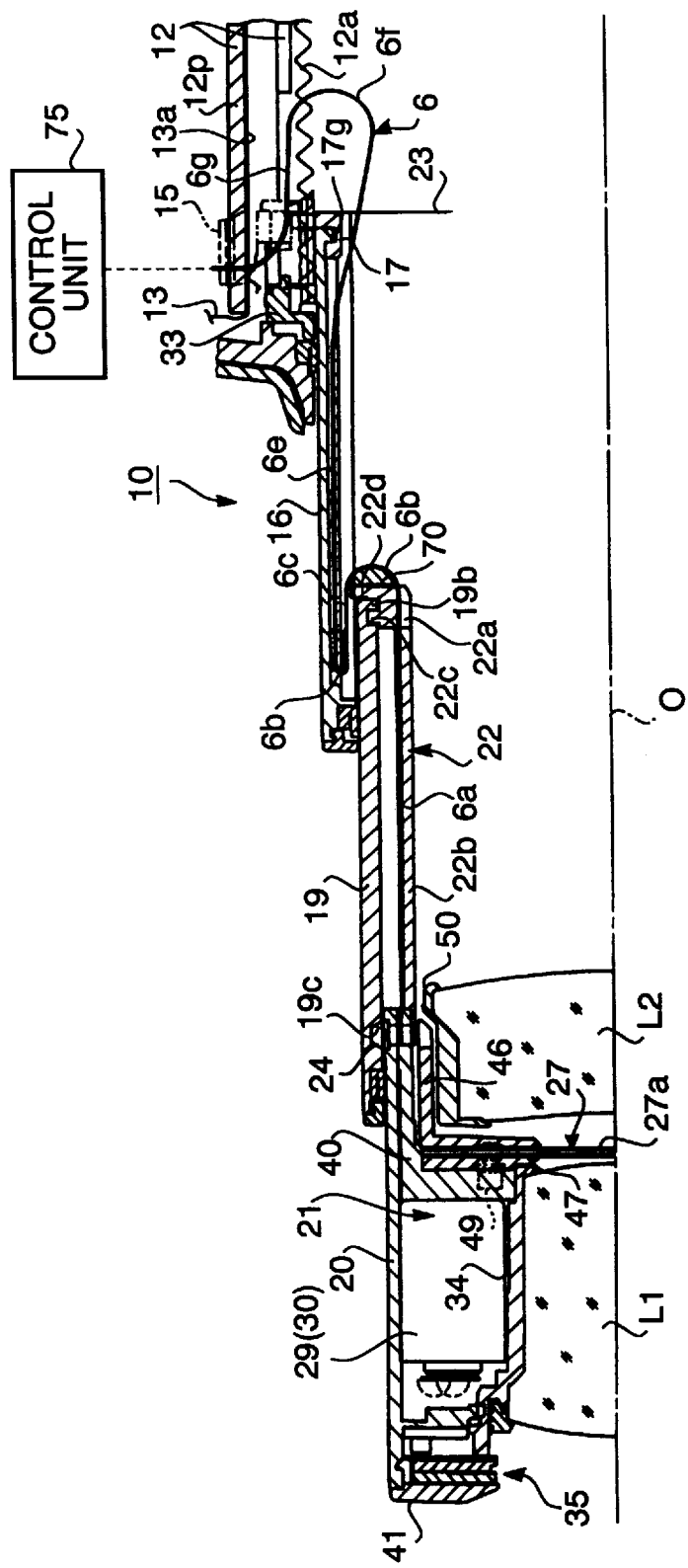
FIG. 8 is a sectional view of an upper part of the zoom lens barrel in a maximum extended state.

A barrier apparatus 35 having barrier blades 48a and 48b is mounted to the front of the first movable barrel 20. On an inner peripheral face of the first movable barrel 20 the AF/AE shutter unit 21 is engaged and fixed, as shown in FIG. 8. The AF/AE shutter unit 21 includes the shutter 27, which consists of three shutter blades 27a The AF/AE shutter unit 21 is provided with a plurality of fixing holes 40a formed at even angular intervals on the outer periphery of the shutter mounting state 40. Only one of the fixing holes 40a appears in each of FIGS. 1–5.

Figure 4:
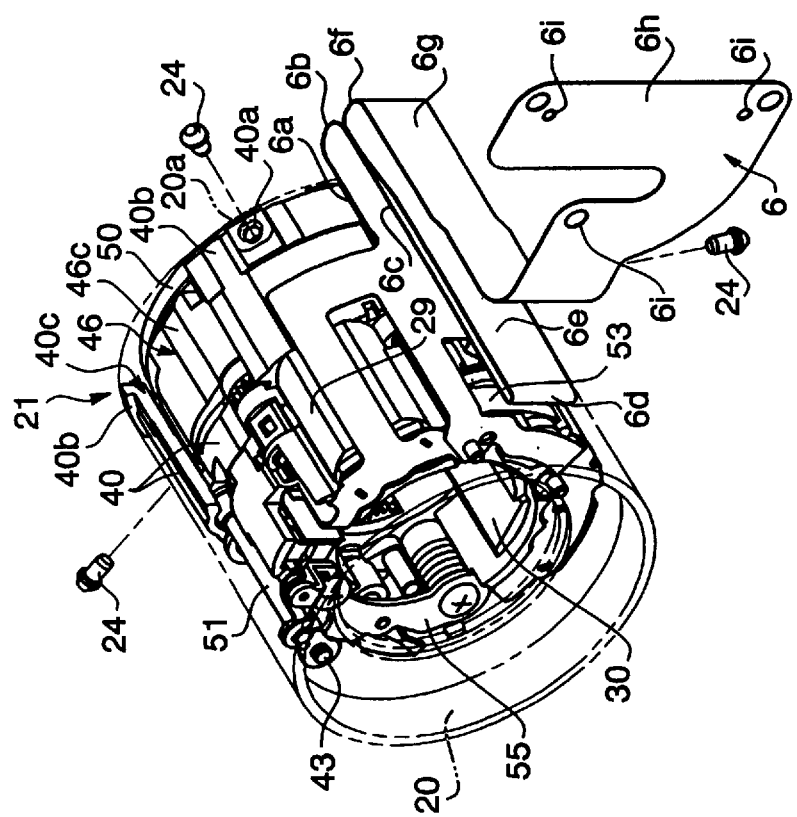
FIG. 4 is a schematic perspective view illustrating a state where an AF/AE shutter unit of the zoom lens barrel is mounted to a first movable barrel.

The aforementioned plurality of follower pins 24, which engage with the inner lead grooves 19c, also serve as device for fixing the AF/AE shutter unit 21 to the first movable barrel 20. The follower pins 24 are inserted and fixed in holes 20a, formed on the first movable barrel 20, and in the fixing holes 40a. With this arrangement the AF/AE shutter unit 21 is secured to the first movable barrel 20 as shown in FIG. 4. In FIG. 4 the first movable barrel 20 is indicated by phantom lines. The follower pins 24 may be fixed by an adhesive, or the pins 24 may comprise as screws which are screwed into the fixing holes 40a.

Figure 5:
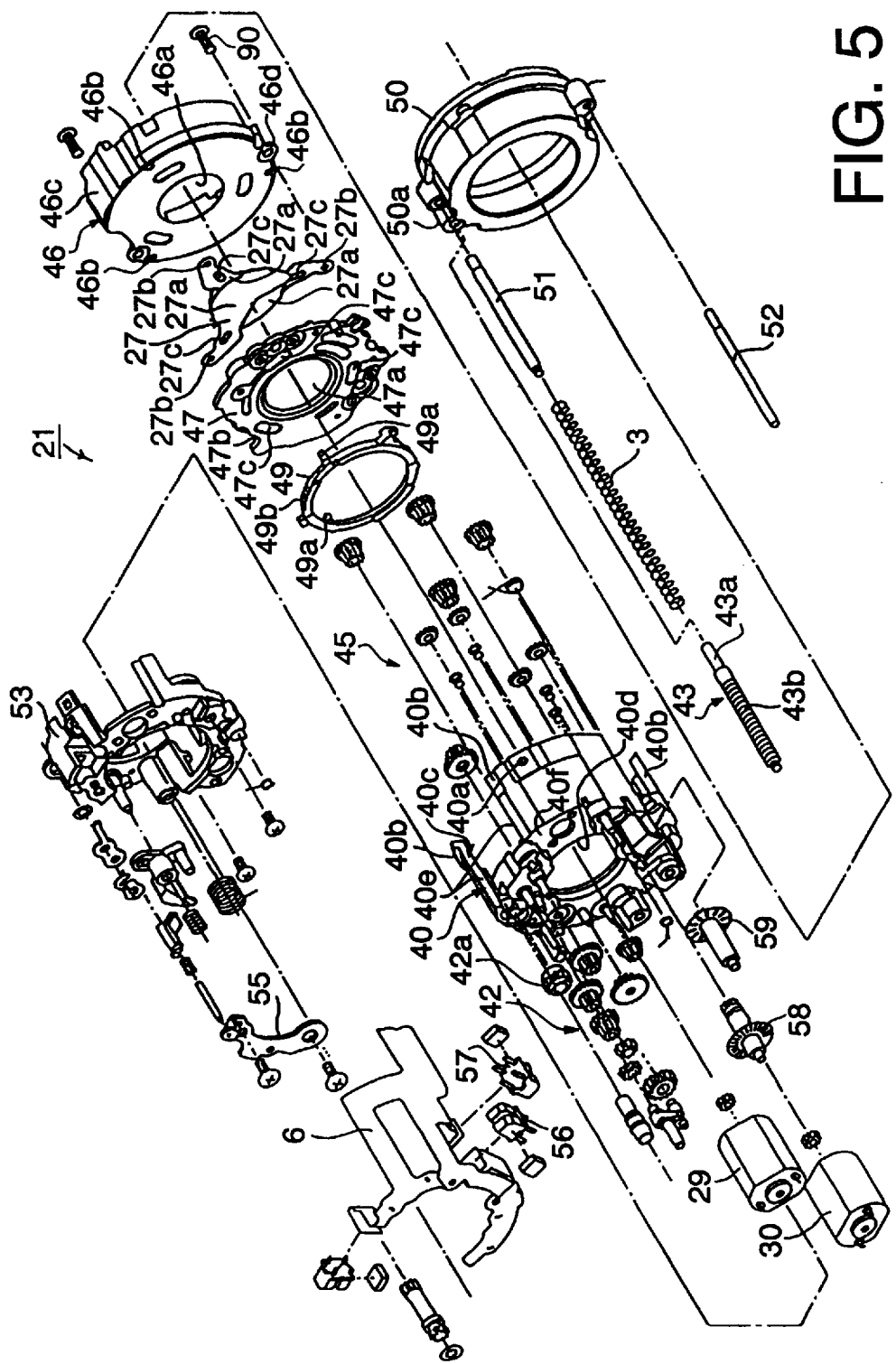
FIG. 5 is an exploded perspective view illustrating main parts of the AF/AE shutter unit of the zoom lens barrel.

As illustrated in FIGS. 5 and 10, the AF/AE shutter unit 21 is provided with the shutter mounting state 40, a shutter blade supporting ring 46 which is fixed on the rear of the shutter mounting stage 40 so as to be located inside the shutter mounting stage 40, and the lens supporting barrel 50 supported such that it is movable relative to the shutter mounting stage 40. The lens supporting barrel 34, the AE motor 29, and the rear lens group driving motor 30, are supported on the shutter mounting stage 40. The shutter mounting stage 40 is provided with an annular member 40f having a circular aperture 40d. The shutter mounting stage 40 is also provided with three legs 40b which project rearwardly with respect to the camera body from the annular member 40*f*. Three slits are defined between the three legs 40*b*. Two of the slits comprise the aforementioned linear guides 40*c*, which slidably engage with the respective pair of guide legs 22*b* of the linear guide member 22, so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photo-interrupters 56, 57*a* and 57*b* which are connected to a flexible printed circuit board 6, and rotating disks 58, 59*a* and 59*b*, having a plurality of radially formed slits provided in the circumferential direction. An encoder for detecting whether the rear lens group driving motor 30 is rotating and for detecting an amount of rotation of the rear lens group driving motor 30 consists of the photo-interrupters 57*a*, 57*b* and the rotating disks 59*a*, 59*b*. An AE motor encoder for detecting whether the AE motor 29 is rotating and for detecting an amount of rotation of the AE motor 29 consists of the photo-interrupter 56 and the rotating disk 58.

The shutter 27, a supporting member 47 which pivotally supports the three shutter blades 27*a* of the shutter 27, and a circular driving member 49, which provides rotative power to the shutter blades 27*a*, are positioned between the shutter mounting stage 40 and the shutter blade supporting ring 46, secured to the shutter mounting stage 40. The circular driving member 49 is provided with three operating projections 49*a* at even angular intervals, which respectively engage with each of the three shutter blades 27*a*. As shown in FIG. 5, the shutter blade supporting ring 46 is provided, at a front end thereof, with a circular aperture 46*a* and with three supporting holes 46*b* positioned at even angular intervals around the circular aperture 46*a*. Two deflection restricting surfaces 46*c* are formed on the outer periphery of the shutter blade supporting ring 46. Each deflection restricting surface 46*c* is exposed outwardly from the corresponding linear guide 40*c* and slidably supports the inner peripheral face of the corresponding guide leg 22*b*.

The supporting member 47, positioned in front of the shutter blade supporting ring 46, is provided with a circular aperture 47*a*, aligned with the circular aperture 46*a* of the shutter blade supporting ring 46, and with three pivotal shafts 47*b* (only one of which is illustrated in FIG. 10) at respective positions opposite the three supporting holes 46*b*. Each shutter blade 27*a* is provided at one end thereof with a hole 27*b* into which the corresponding pivotal shaft 47*b* is inserted, such that each shutter blade 27*a* is rotatable about the corresponding pivotal shaft 47*b*. The major part of each shutter blade 27*a*, that extends normal to the optical axis 0 from the pivoted end, is formed as a light-interceptive portion. All three light-interceptive portions of the shutter blades 27*a* together prevent ambient light, which enters the front lens group L1, from entering the circular apertures 46*a* and 47*a* when the shutter blades 27*a* are closed. Each shutter blade 27*a* is further provided, between the hole 27*b* and the light-interceptive portion thereof, with a slot 27*c*, through which the corresponding operating projection 49*a* is inserted. The supporting member 47 is fixed to the shutter blade supporting ring 46 in such a manner that, each shaft 47*b*, which supports the corresponding shutter blade 27*a*, is engaged with the corresponding supporting hole 46*b* of the shutter blade supporting ring 46.

A gear portion 49*b* is formed on a part of the outer periphery of the circular driving member 49. The gear portion 49*b* meshes with one of the plurality of gears in the gear train 45 to receive the rotation force from the gear train 45. The supporting member 47 is provided, at respective positions close to the three pivotal shafts 47*b*, with three arc grooves 47*c* each arched along a circumferential direction. The three operating projections 49*a* of the circular driving ring 49 engage with the slots 27*c* of the respective shutter blades 27*a* through the respective arc grooves 47*c*. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46*d* provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42*a*, provided as one of the gears in the gear train 42, is provided with a female thread hole (not shown) at the axial center thereof, and is restricted to move in the axial direction. The screw shaft 43, one end of which is fixed to the lens supporting barrel 50, engages with the female thread hole of the driving gear 42*a*. Accordingly, the driving gear 42*a* and the screw shaft 43 together constitute a feed screw mechanism. In such a manner, when the driving gear 42*a* rotates forwardly or reversely due to driving by the rear lens group driving motor 30, the screw shaft 43 moves forwardly or rearwardly with respect to the driving gear 42*a*, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws (not shown). The motors 29, 30 and the photo-interrupters 56, 57*a* and 57*b* are connected to the flexible printed circuit board 6. One end of the flexible printed circuit board 6 is fixed to the shutter mounting stage 40.

After the first, second and third movable barrels 20, 19 and 16, and the AF/AE shutter unit 21, etc. are assembled, the aperture plate 23 is fixed to the rear of the linear guide barrel 17, and a supporting member 33 having a circular shape is fixed at the front of the fixed lens barrel block 12.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens groups.

In addition, in the above embodiment, the rear lens group L2 is supported on the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be constructed in such a manner that the rear lens group L2 is not supported by the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

The operation of the zoom lens barrel 10, by rotation of the whole optical unit driving motor 25 and the rear lens group driving motor 30, will now be described with reference to FIGS. 8 and 9.

Figure 9:
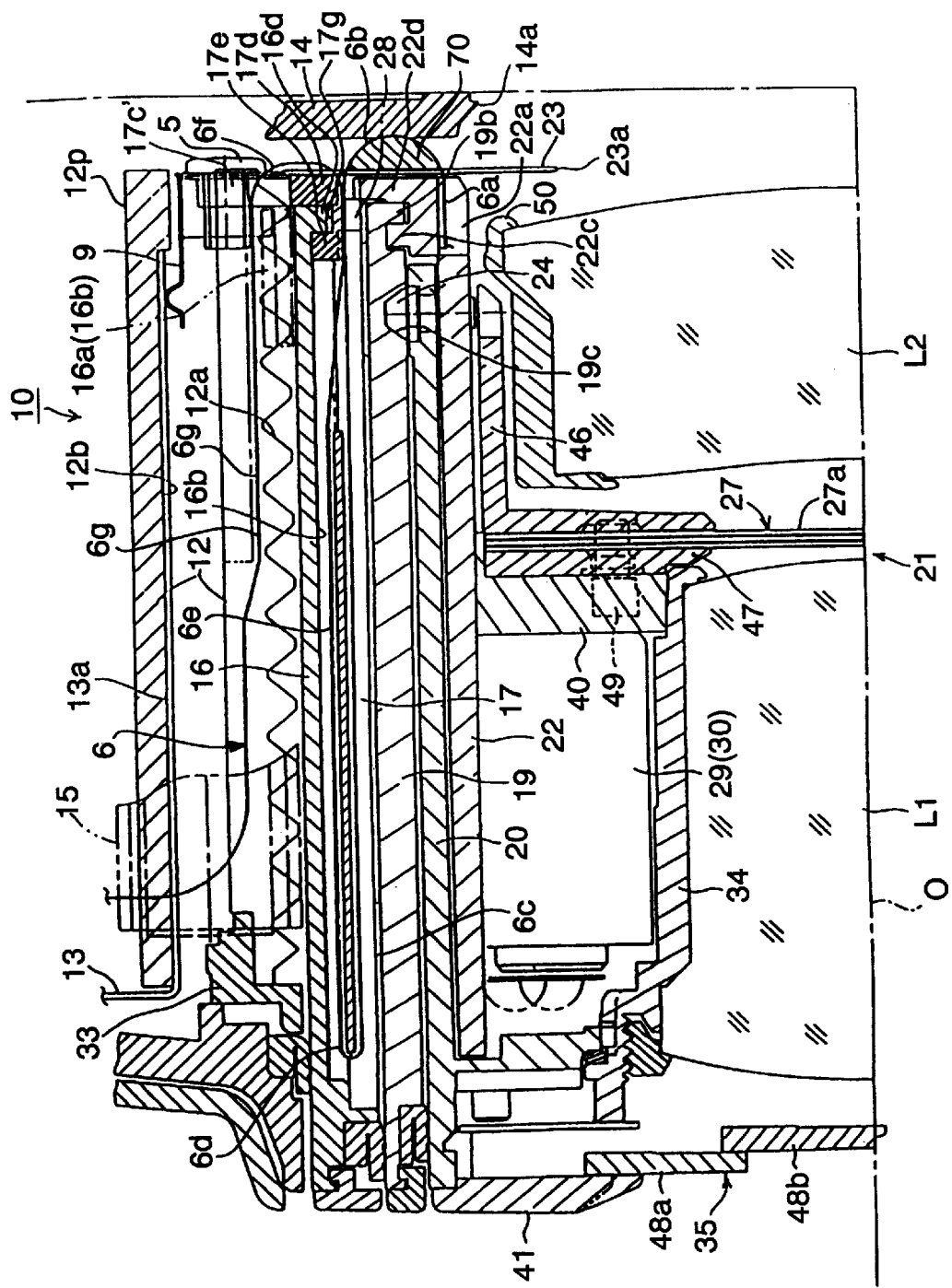
FIG. 9 is a sectional view of an upper part of the zoom lens barrel in a housed state.

As shown in FIG. 9, when the zoom lens barrel 10 is at the most retracted (withdrawn) position, i.e., the lens-housed condition. When the power switch is turned ON, the drive shaft of the whole optical unit driving motor 25 is driven to rotate in the forward rotational direction by a small amount. This rotation of the motor 25 is transmitted to the driving pinion 15 through a gear train 26, which is supported by a supporting member 32 integrally formed with the fixed lens barrel block 12, to rotate the third movable barrel 16 in one predetermined rotational direction to advance forwardly along the optical axis 0. Therefore, the second movable barrel 19 and the first movable barrel 20 are each advanced by a small amount in the optical axis direction, along with the third movable barrel 16. Consequently, the camera is placed in a state capable of photographing, with the zoom lens positioned at the widest position, i.e., the wide end. In this state, the focal length may be detected in accordance with the amount of relative movement between the sliding movement of the code plate 13a and the contacting terminal 9 as the linear guide barrel 17 moves with respect to the fixed lens barrel block 12.

In the photographable state as above described, when the aforementioned zoom operating lever is manually moved towards a "tele" side, or the "tele" zoom button is manually depressed to be turned ON, the whole optical unit driving motor 25 is driven to rotate in the forward rotational direction through the whole optical unit driving motor controller 60. The rotation of the optical unit driving motor 25 causes the third movable barrel 16 to rotate in the rotational direction to advance along the optical axis 0 via the driving pinion 15 and the outer peripheral gear 16b. Therefore, the third movable barrel 16 is advanced from the fixed lens barrel block 12, according to the relationship between the female helicoid 12a and the male helicoid 16a. At the same time, the linear guide barrel 17 moves forwardly along the optical axis 0 together with the third movable barrel 16, without relatively rotating with respect to the fixed lens barrel block 12, and in accordance with the relationship between the engaging projections 17c and the linear guide grooves 12b. At this time, the simultaneous engagement of the follower pins 18 with the respective lead slots 17b and the linear guide grooves 16c causes the second movable barrel 19 to move forwardly relative to the third movable barrel 16 in the optical axis direction. In addition, the second movable barrel 10 rotates together with the third movable barrel 16 in the same rotational direction relative to the fixed lens barrel block 12. The first movable barrel 20 moves forwardly from the second movable barrel 19 along the optical axis 0 together with the AF/AE shutter unit 21, without relatively rotating with respect to the fixed lens barrel block 12 due to the above-noted structures in which the first movable barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length is detected.

Conversely, when the zoom operating lever is manually moved towards a "wide" side, or the "wide" zoom button is manually depressed to be turned ON, the whole optical unit driving motor 25 is driven to rotate in the reverse rotational direction by the whole optical unit driving motor controller 60, so that the third movable barrel 16 rotates in the rotational direction to retract into the fixed lens barrel block 12 together with the linear guide barrel 17. At the same time, the second movable barrel 19 is retracted into the third movable barrel 16 while rotating in the same direction as that of the third movable barrel 16, and the first movable barrel 20 is retracted into the rotating second movable barrel 19 together with the AF/AE shutter unit 21. During the above retraction driving, similar to the case of advancing driving as above described, the rear lens group driving motor 30 is not driven.

While the zoom lens barrel 10 is driven during the zooming operation, the front lens group L1 and the rear lens group L2 move as a whole, since the rear lens group driving motor 30 is not driven, which maintains a constant distance between the lens groups, as shown in FIG. 8. The focal length is input via the zoom code plate 13a and the contacting terminal 9 is indicated on an LCD panel (not shown) provided on the camera body.

At any focal length, when the release button is depressed by a half-step, the object distance measuring apparatus 64 is actuated to measure an object distance. At the same time, the photometering apparatus 65 is actuated to measure an object brightness. Thereafter, when the release button is fully depressed, the whole optical unit driving motor 25 and the rear lens group driving motor 30 are each driven by respective amounts each corresponding to the focal length information set in advance and the object distance information obtained from the object distance measuring apparatus 64, so that the front and rear lens groups L1 and L2 are respectively moved to specified positions to obtain a specified focal length and also to bring the object into focus. Immediately after the object is brought into focus, via the AE motor controller 66, the AE motor 29 is driven to rotate the circular driving member 49 by an amount corresponding to the object brightness information obtained from the photometering apparatus 65, so that the shutter 27 is driven to open the shutter blades 27a by a predetermined amount which satisfies the required exposure. Immediately after the three shutter blades 27a are opened and subsequently closed, the whole optical unit driving motor 25 and the rear lens group driving motor 30 are both driven to move the front lens group L1 and the rear lens group L2 to respective initial positions at which they were at prior to a shutter release.

An embodiment of the flexible printed circuit board housing structure will now be described with reference to FIGS. 8, 9 and 12–21.

Figure 12:
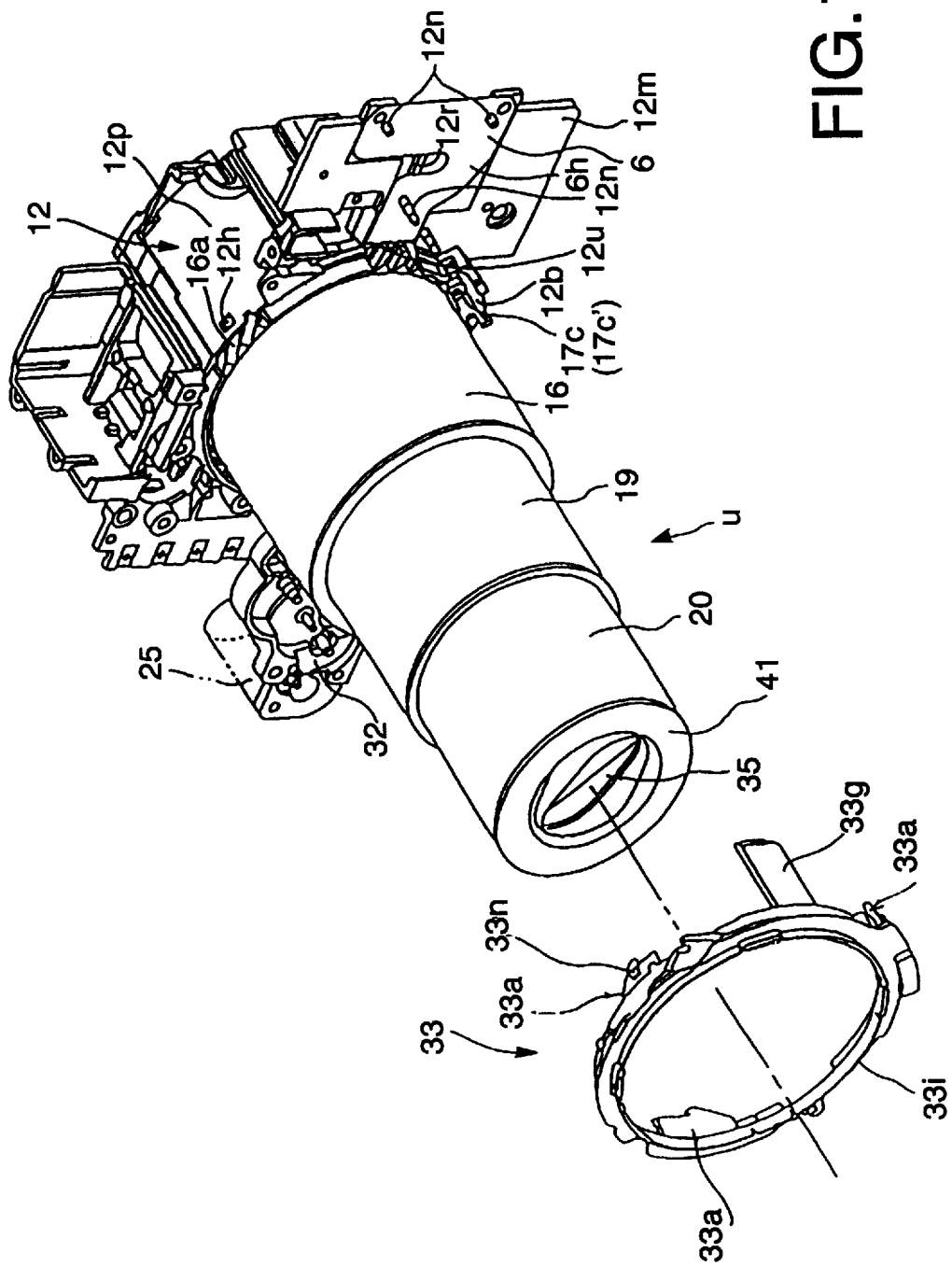
FIG. 12 is an external perspective view which shows major parts of the zoom lens barrel.
Figure 18:
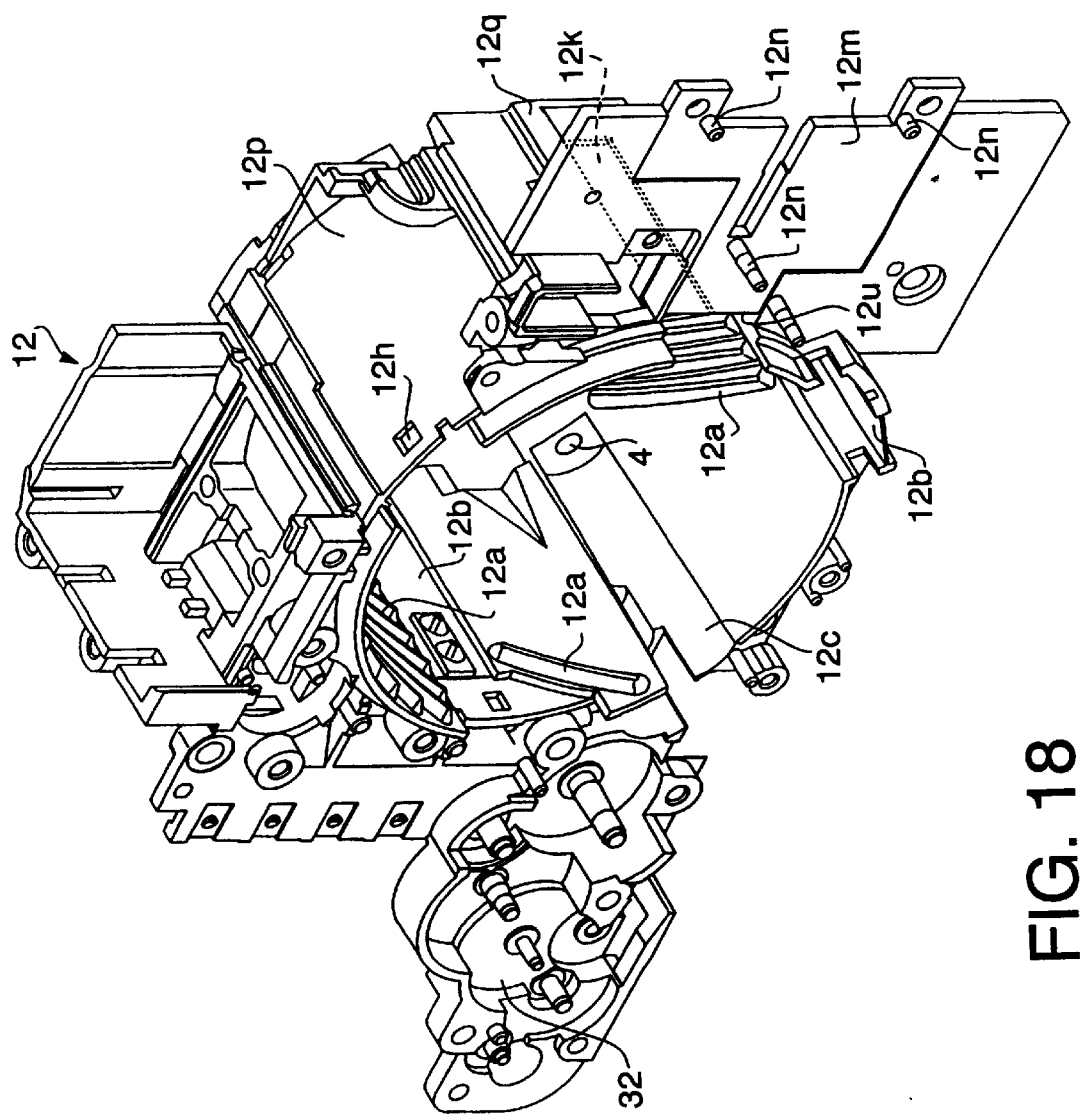
FIG. 18 is an external perspective view of a fixed lens barrel block.

As shown in FIGS. 12 and 18, the fixed lens barrel block 12 is provided with a barrel portion 12p, an FPC fixing part 12m, and a supporting part 32. The supporting part 32 is formed on one side of the barrel portion 12p and the FPC fixing part 12m is formed on the other side, opposite the supporting part 32.

The FPC fixing part 12m is formed projecting sideways (i.e., toward the right as shown in FIGS. 12 and 18) near the front of the barrel portion 12p. A flexible printed circuit board relief hole 12k (FPC relief hole) is formed on the barrel portion 12p to the rear of the FPC fixing part 12m. The FPC relief hole 12k is formed parallel to the optical axis 0 and is sufficiently large to allow the flexible printed circuit board 6 to protrude outward.

The fixing part 12m is provided with a plurality of fixing protrusions 12n and the flexible printed circuit board 6 is attached to the fixing part 12m by fitting a plurality of fixing holes 6i (see, for example, FIG. 13) to the plurality of fixing protrusions 12n.

Figure 19:
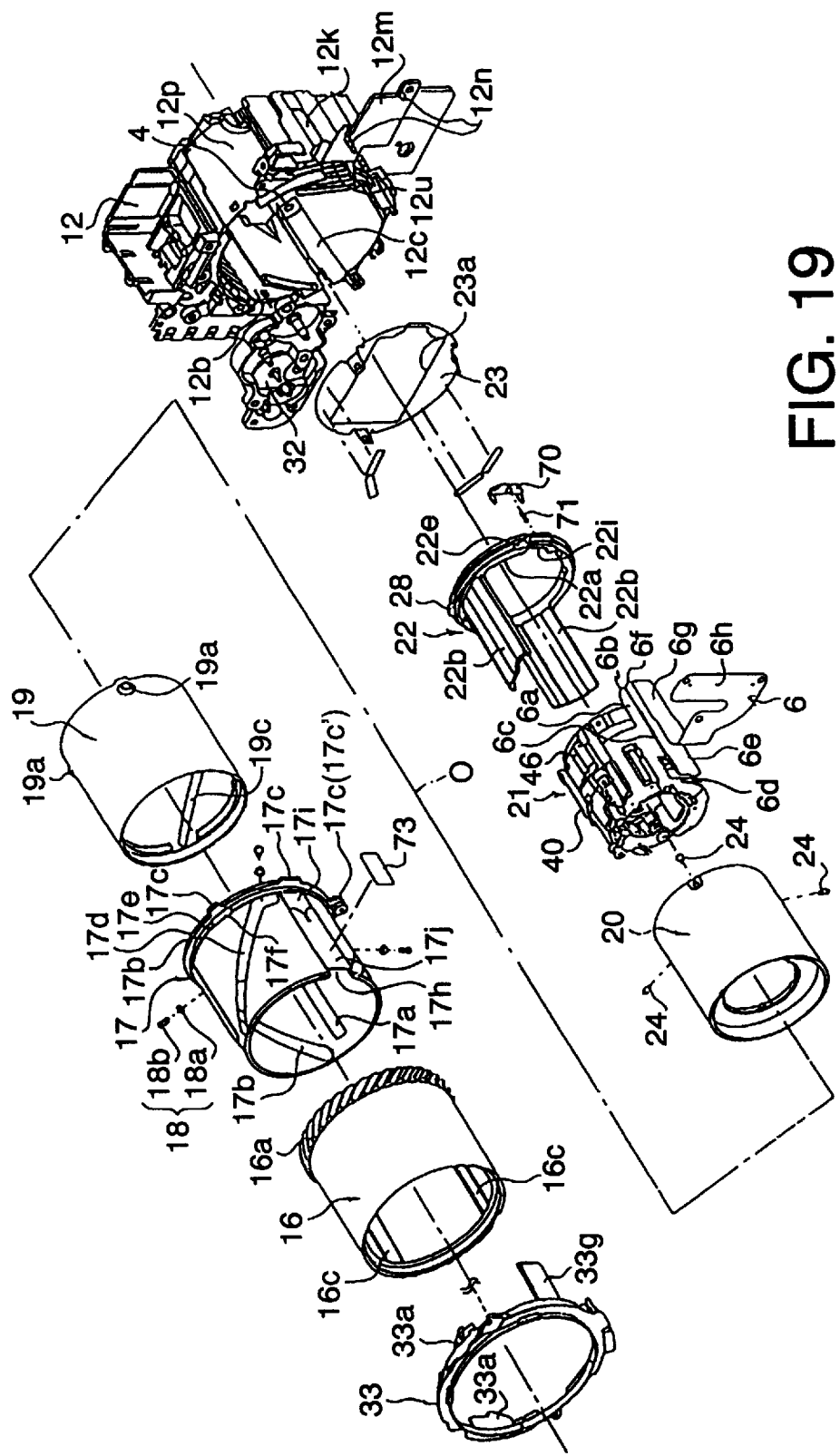
FIG. 19 is an exploded perspective view showing the zoom lens barrel.

In order to guide the flexible printed circuit board 6, the rectilinear guide barrel 17 further includes, on its inner peripheral face, a flexible printed circuit board lead-in groove 17h (FPC lead-in groove), which runs parallel to the optical axis 0 and guides the flexible printed circuit board 6 (see FIG. 19). The FPC lead-in groove 17h includes a through hole 17i that passes through the linear guide barrel 17 at the rear of the FPC lead-in groove 17h.

Also, to guide the flexible printed circuit board 6, the annular part 22a further includes a guide groove 22i, which allows the passage of, and rectilinearly guides, the flexible printed circuit board 6 (see FIG. 19). The annular part 22a also supports a spring support part 70, which resiliently supports the flexible printed circuit board 6.

Figure 20:
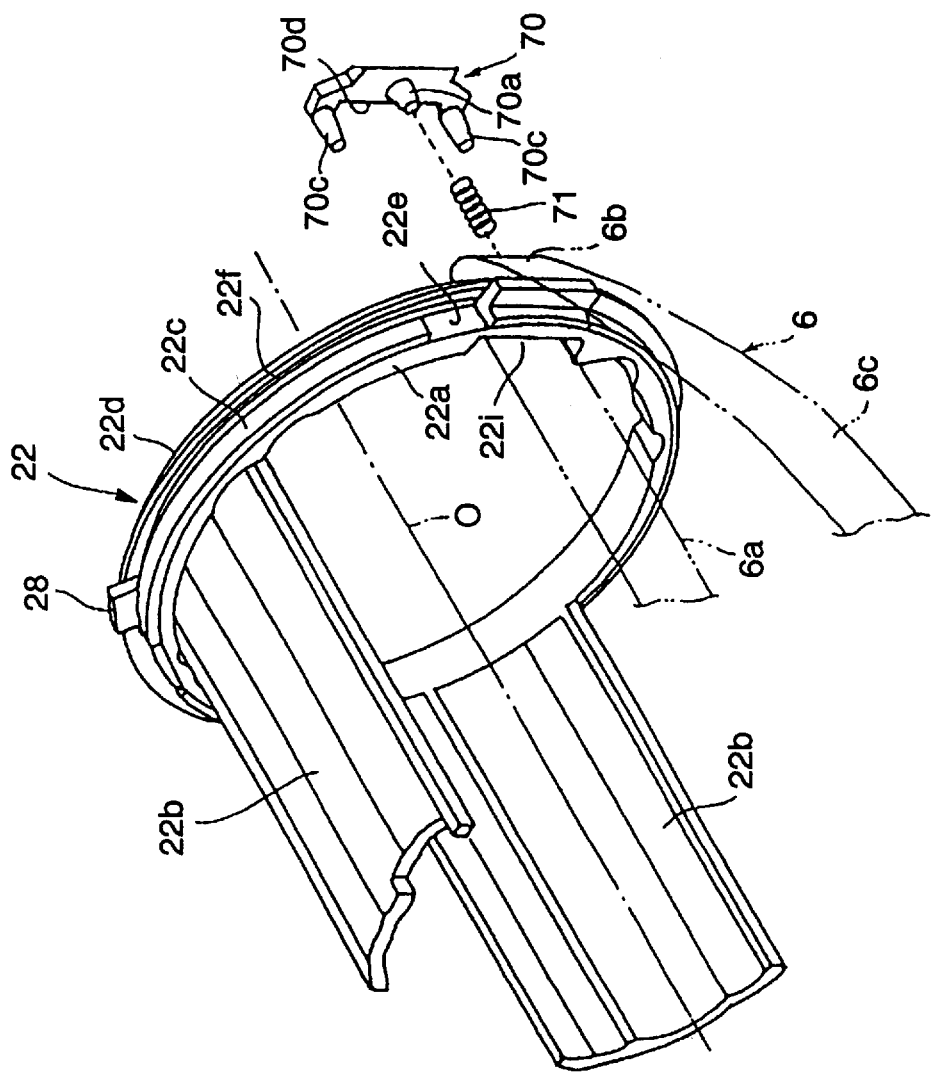
FIG. 20 is an enlarged perspective view showing the rectilinear guide barrel of the zoom lens barrel.
Figure 21:
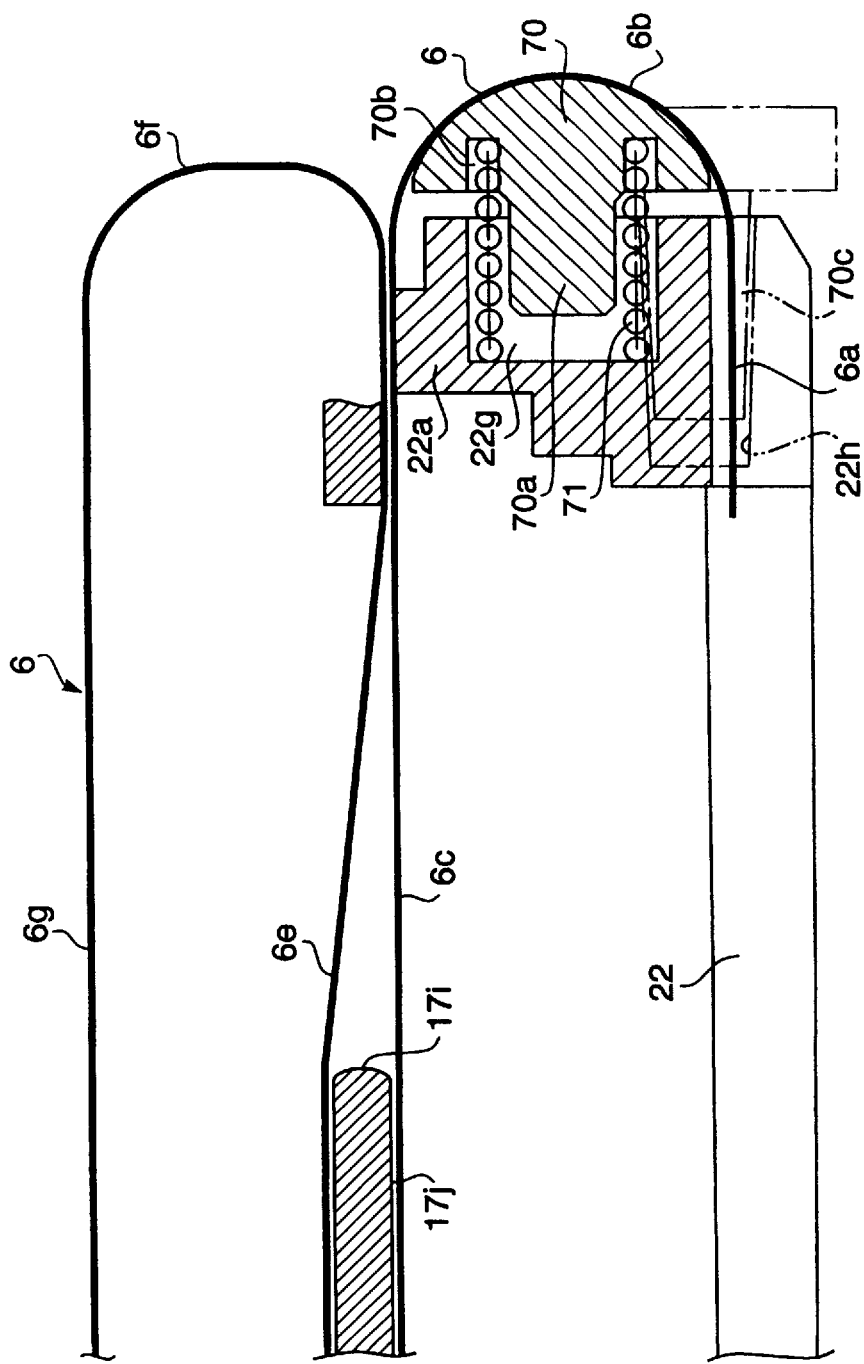
FIG. 21 is a cross-section showing a spring support at an end of the rectilinear guide member of the zoom lens barrel.

As shown in FIGS. 20 and 21, the spring support part 70 includes two guiding protrusions 70c, which protrude toward the front of the camera, a spring bearing protrusion 70a, which is positioned between the two guiding protrusions 70c, and a spring housing groove 70b, which is provided at the base of the spring bearing protrusion 70a. The rear face of the linear guide member 22 includes two sliding support holes 22h and a spring hole 22g, which is positioned between the two sliding supporting holes 22h. The two guiding protrusions 70c are slidably fitted into the two sliding supporting holes 22h (not shown). A compression spring 71 is placed on the spring bearing protrusion 70a and is supported in the spring housing groove 70b. The spring bearing protrusion 70a is then inserted into the spring hole 22g and the spring 71 is compressed inside the spring hole 22g. The spring support part 70 also includes a guide groove 70d that substantially coincides with the guide groove 22f when the spring bearing protrusion 70a is inserted into the spring hole 22g.

With the above arrangement, the spring support part 70 is positioned at the rear of the linear guide member 22 (i.e., the rear of the first movable barrel 20) such that the flexible printed circuit board 6 is resiliently supported in a direction parallel to the optical axis 0.

Further, the retaining member 33 is fixed at the front of the fixed lens barrel block 12 and includes a stopping protrusion 33a, which engages with the front end of the fixed lens barrel block 12, and a restricting protrusion 33g, which fits into the FPC relief hole 12k from the front side (see FIG. 12). The restricting protrusion 33g guides the flexible printed circuit board 6 and restricts the rotation of the retaining member 33 with respect to the barrel part 12p of the fixed lens barrel block 12.

The flexible printed circuit board 6 connects the AF/AE shutter unit 21 with a control unit 75 (see FIG. 8) that is mounted on the camera body. The control unit 75 includes, for example, a CPU (not shown), the AE motor controller 66, the whole optical unit driving motor controller 60, the rear lens group driving motor controller 61, the object distance measuring apparatus 64, and the photometering apparatus 65. The control unit 75 is also connected to, for example, the zoom operating device 62 and the focus operating device 63.

The flexible printed circuit board 6 is defined as including a number of segments, as follows: a first rectilinear segment 6a, which extends from the AF/AE shutter unit 21 to the rear of the linear guide member 22; a first U-shaped segment 6b, which is formed by bending the flexible printed circuit board 6 forward over the spring support part 70 and inserting the flexible printed circuit board 6 into the guide groove 22i at the rear of the rectilinear guide member 22; a second rectilinear segment 6c, which extends frontward along the FPC lead-in groove 17h; a second U-shaped segment 6d, which is formed by bending the flexible printed circuit board 6 toward the rear around the front end of the FPC lead-in groove 17h; a third rectilinear segment 6e, which extends rearward along an outer face 17j of the FPC lead-in groove 17h (the inner face of the third movable barrel 16), and at the rear end of the FPC lead-in groove 17h, is lead to the inner face of the rectilinear guide barrel 17 via the through hole 17i; a third U-shaped segment 6f, which is formed to pass the flexible printed circuit board 6 through the FPC relief hole 12k of the fixed lens barrel block 12; a fourth rectilinear segment 6g, which extends from the third U-shaped segment 6f; and a fixed end segment 6h, which is fixed to the fixed part 12m at the outer side of the fixed lens barrel block 12 (see, in particular FIGS. 8 and 9).

Further, the third rectilinear segment 6e of the flexible printed circuit board 6 is secured to the outer face 17j of the linear guide barrel 17 by, for example, double-sided tape 73 (FIG. 19).

In other words, the flexible printed circuit board 6 is lead rearward from the AF/AE shutter unit 21 on the inner side of the second movable barrel 19, bent forward once at the rear end of the second movable barrel 19, lead forward inside the FPC lead-in groove 17h of the linear guide barrel 17, bent along the outer face 17j of the linear guide barrel 17 from the front end of the FPC lead-in groove 17h, stuck to the outer face 17j with the double-sided tape 73, guided again to the inner face of the rectilinear guide barrel 17 via the through hole 17i, and then bent out through the FPC relief hole 12k and attached to the fixing part 12m of the fixed lens barrel block 12.

Figure 14:
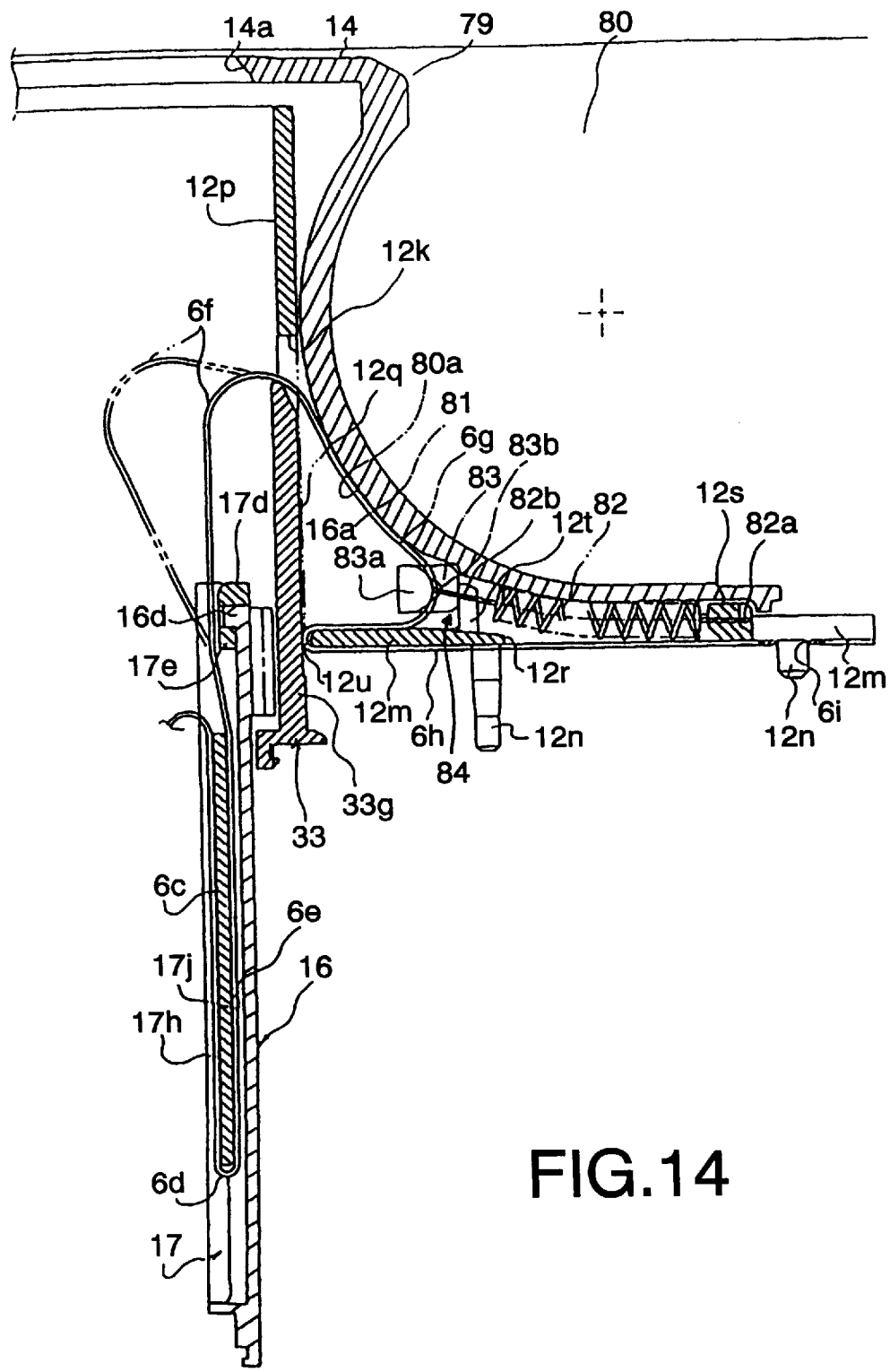
FIG. 14 is a sectional plan view of the FPC housing structure in a different condition than in FIG. 13.
Figure 15:
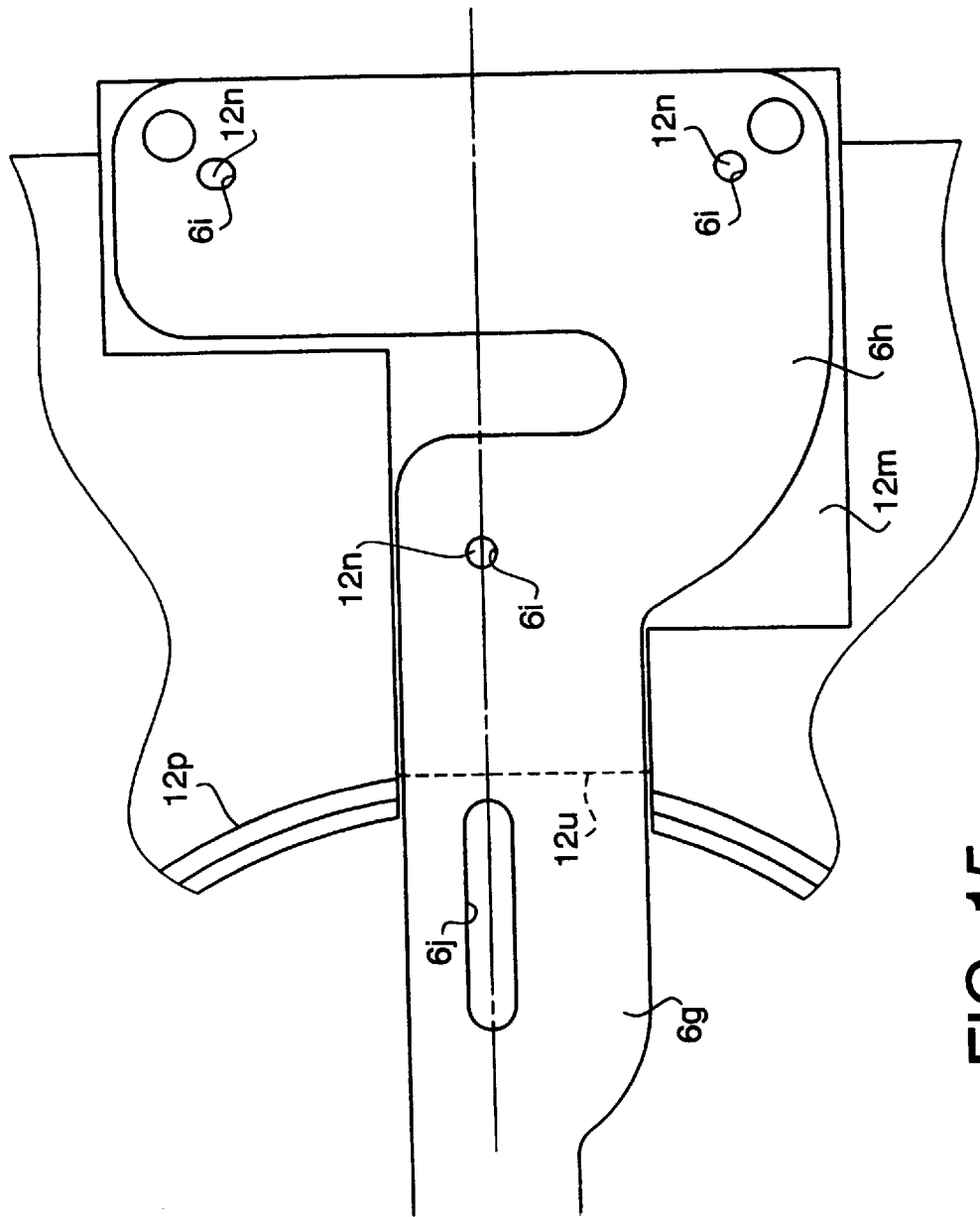
FIG. 15 is an enlarged front view showing the structure of an end part of a flexible printed circuit board.

Since the flexible printed circuit board 6 is fixed to the linear guide barrel 17 by the double-sided tape 73, when the linear guide barrel 17 extends from the barrel part 12p of the fixed lens barrel block 12, the third U-shaped segment 6f of the flexible printed circuit board 6 slacks and may obstruct light passing through the camera (as shown by the dashed lines in FIG. 14).

In the present embodiment, the flexible printed circuit board 6 slack is stored in the otherwise unused space occurring around a cartridge chamber (for holding the camera film) or a spool chamber (for holding the windup spool for winding the film from said cartridge chamber).

Figure 13:
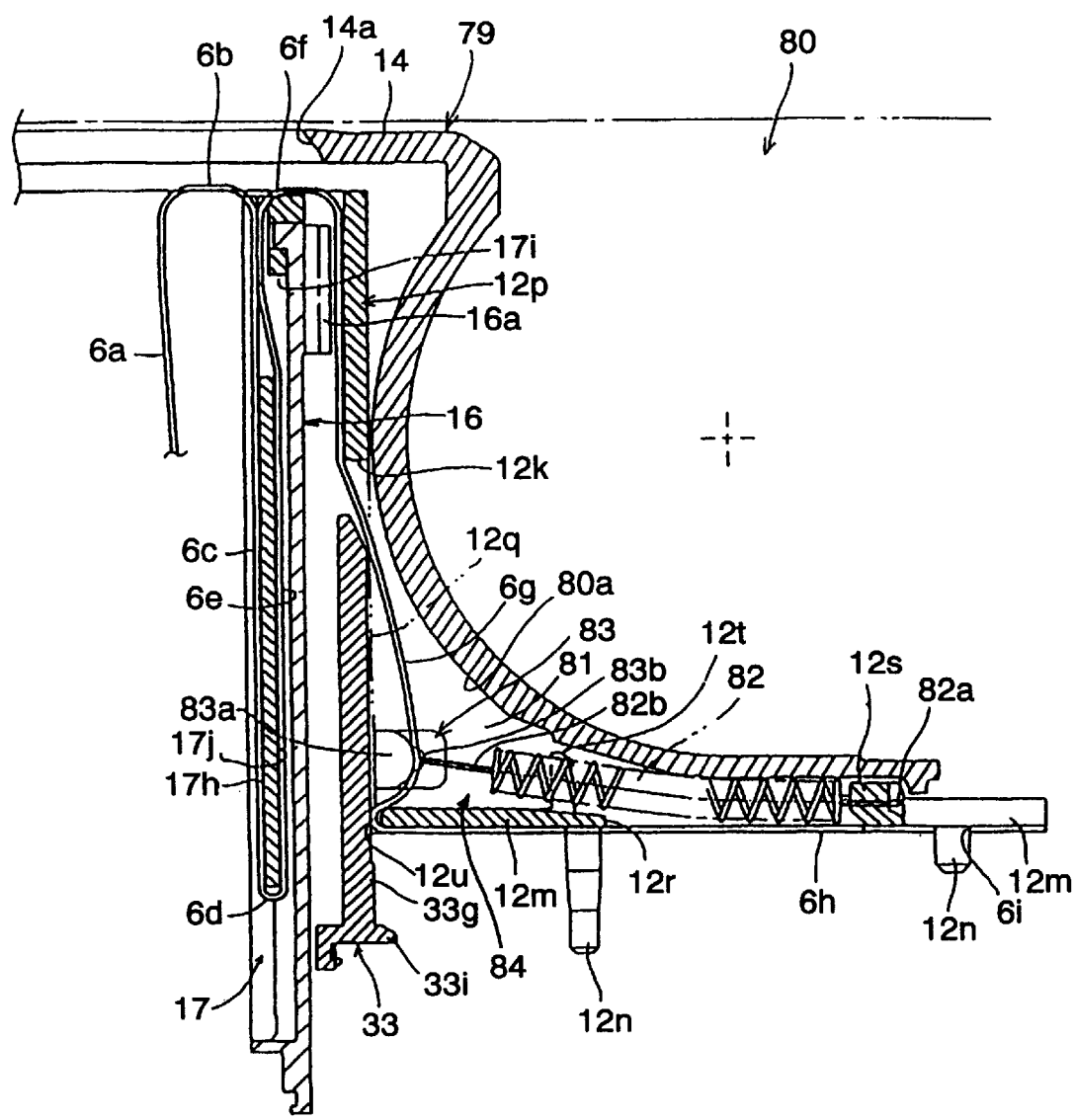
FIG. 13 is a sectional plan view of a flexible printed circuit board (FPC) housing structure.

In particular, the fixed lens barrel block 12 is fixed to a camera body 79. The camera body 79 is provided with an integral cartridge chamber (or spool chamber) 80 and the aperture plate 14. The third movable barrel 16 is screwed into the barrel part 12p as shown in FIG. 13. With this arrangement, a space is created by a rounded outer wall face 80a of the cartridge chamber 80, an outer wall face 12q of the barrel part 12p, and a rear surface of the fixed part 12m of the fixed lens barrel block 12. This space, referred to as "dead space" because it is otherwise unused, is used as the FPC housing space 81 to store the slack of the flexible printed circuit board 6.

In order to make efficient use of the FPC housing space 81, the flexible printed circuit board 6 is fed into and out of the FPC housing space 81 such that the length of the flexible printed circuit board 6 is perpendicular to the axis of the cartridge chamber 80 or is wrapped around the curved outer surface of the cartridge chamber 80. This arrangement is more efficient than, for example, the case where the flexible printed circuit board 6 is fed into and out of the FPC housing space obliquely with respect to the axis of the cartridge chamber 80.

In order to draw the flexible printed circuit board 6 into the FPC housing space 81, the FPC housing space 81 is provided with a spring mechanism 84 which pulls the flexible printed circuit board 6 inside the housing space 81. In particular, the spring mechanism 84 pulls the flexible printed circuit board 6 in a direction that is perpendicular to the optical axis 0. Alternatively, a compression spring (not shown) could be used to push the flexible printed circuit board 6 into the housing space 81.

Figure 16:
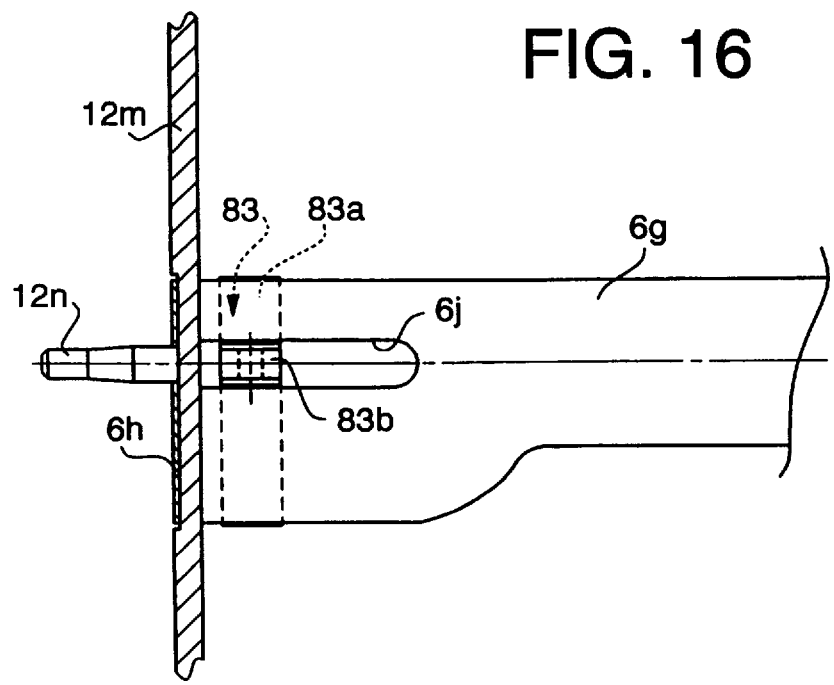
FIG. 16 is an enlarged side view showing the structure of the end part of the flexible printed circuit board.
Figure 17:
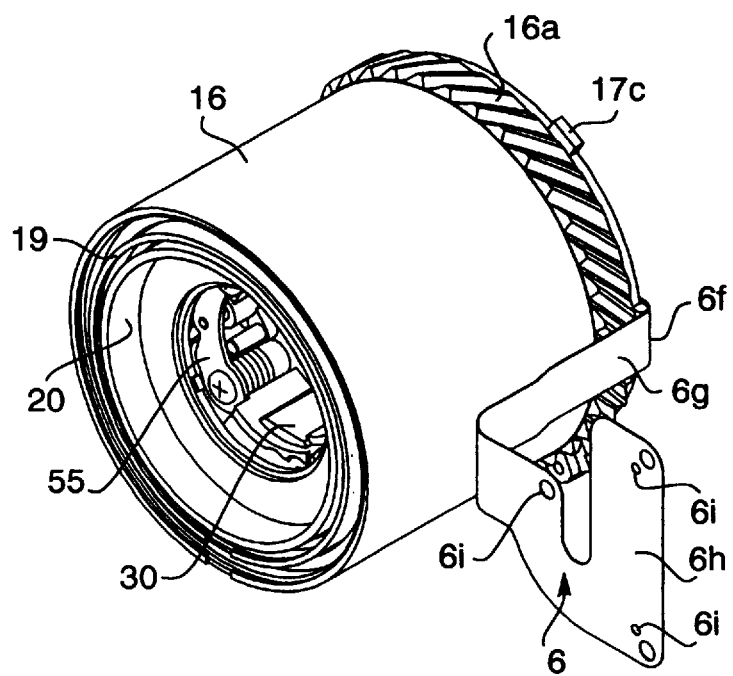
FIG. 17 is a perspective view of an assembly of three barrels.

Also, the spring mechanism 84 includes a tension spring 82 and a spring bearing pin 83. As shown in FIG. 16, the spring bearing pin 83 includes a contacting part 83a, and a spring hooking part 83b, which is positioned at substantially the center of the contacting part 83a. Further, the fourth rectilinear part 6g of the flexible printed circuit board 6 is formed with a lengthwise slot 6j (see FIG. 15) at a position that is near to the fixed end segment 6h but inside the FPC housing space 81.

The tension spring 82 is hooked at one end to an anchoring protrusion 12s that is provided on the fixed part 12m, and at the other end, to the spring hooking part 83b of the spring bearing pin 83. As shown in FIG. 16, the contacting part 83a has a width which is slightly less than the width of the slot 6j such that the contacting part 83a is insertable through the slot 6j to be positioned perpendicular to the lengthwise direction of the flexible printed circuit board 6. Thus, the tension spring 82 applies a force to the flexible printed circuit board 6 pulling the fourth rectilinear segment 6g into the FPC housing space 81.

The slack of the flexible printed circuit board 6 at the third U-shaped part 6f and the fourth rectilinear part 6g is thus pulled into and fed out of the FPC housing space 81 during the movement of the linear guide barrel 17.

Further, with this arrangement, since the spring bearing pin 83 pulls the fourth rectilinear part 6g while sliding along the slot 6j, the spring force is applied over a broader region and the spring extends by only a small amount.

Thus, with the present FPC housing structure, the slack in the flexible printed circuit board 6 is stored in the otherwise unused space formed by the rounded outer wall face 80a of the cartridge chamber (or spool chamber) 80 and the outer wall face 12q and the fixed part 12m of the barrel part 12p so that the camera can be made compact. Furthermore, since the spring mechanism 84 only requires two parts (the tension spring 82 and the spring bearing pin 83), the FPC housing structure is easily assembled.

Although the structure and operation of a flexible printed circuit board housing structure is described herein with respect to the preferred embodiments, many modifications and changes can be made without departing from the spirit and scope of the invention.

The present disclosure relates to subject matter contained in Japanese Patent Application Nos. HEI 08-012317, filed on Jan. 26, 1996, HEI 08-029486, filed on Feb. 16, 1996, and HEI 08-029487, filed on Feb. 16, 1996, which are expressly incorporated herein be reference in their entirety.

What is claimed is:

1. A flexible printed circuit board housing structure for a camera, said camera including a movable barrel that moves along an optical axis of a lens of the camera and a flexible printed circuit board electrically connecting an electrical unit on said movable barrel to a unit on said camera, said flexible printed circuit board housing structure comprising:

a flexible printed circuit board housing space formed on said camera and defined by a substantially cylindrical wall face of a film chamber; and a spring mechanism provided in said flexible printed circuit board housing space, said spring mechanism applying an urging force to said flexible printed circuit board, said urging force urging said flexible printed circuit board in a direction away from the optical axis and into said flexible printed circuit board housing space, said substantially cylindrical wall face of said film chamber comprising a guiding structure that guides a slack portion of said flexible printed circuit board in a direction away from the optical axis.

2. The flexible printed circuit board housing structure according to claim 1, wherein said spring mechanism urges said flexible printed circuit board in a direction perpendicular to the optical axis of said camera.

3. The flexible printed circuit board housing structure according to claim 1, wherein said substantially cylindrical wall face is positioned such that, as said spring mechanism urges said flexible printed circuit board into said flexible printed circuit board housing space, said flexible printed circuit board curves around said curved wall face.

4. The flexible printed circuit board housing structure for a camera according to claim 1, said spring mechanism comprising a spring coupled to said flexible printed circuit board via an aperture in said flexible printed circuit board.

5. The flexible printed circuit board housing structure according to claim 1, said spring mechanism comprising a spring having a direction of elongation, said direction of elongation extending in a direction transverse to the optical axis.

6. A flexible printed circuit board housing structure for a camera, said camera including a movable barrel that moves along an optical axis of a lens of the camera and a flexible printed circuit board electrically connecting an electrical unit on said movable barrel to a unit on said camera, said flexible printed circuit board housing structure comprising:

a flexible printed circuit board housing space formed on said camera; and a spring mechanism provided in said flexible printed circuit board housing space, said spring mechanism applying an urging force to said flexible printed circuit board, said urging force urging said flexible printed circuit board in a direction away from the optical axis and into said flexible printed circuit board housing space;

said spring mechanism comprises a spring bearing pin, an end of said flexible printed circuit board is fixed to said flexible printed circuit board housing space, a slot, having a predetermined length, is formed lengthwise on a part of said flexible printed circuit board located inside said flexible printed circuit board housing space, and said spring bearing pin is movably fitted into said slot and said urging force is applied to said flexible printed circuit board via said spring bearing pin.

7. A flexible printed circuit board housing structure for a camera, said camera including a control unit, a film chamber for holding film, a camera aperture, a stationary barrel positioned in front of the camera aperture, a movable barrel provided with an electrical unit, said movable barrel being supported on said stationary barrel in a manner adapted to be movable in the optical axis direction, a flexible printed circuit board for electrically connecting said electrical unit with said control unit, said flexible printed circuit board housing structure comprising:

a flexible printed circuit board housing space, formed between said stationary barrel and a substantially cylindrical wall face of said film chamber, said substantially cylindrical wall face of said film chamber comprising a guiding structure that guides a slack portion of said flexible printed circuit board in a direction away from an optical axis of a lens of the camera; and a flexible printed circuit board relief hole, which is formed in said stationary barrel and which extends to said flexible printed circuit board housing space, wherein said flexible printed circuit board is led, via said flexible printed circuit board relief hole, to said flexible printed circuit board housing space.

8. The flexible printed circuit housing structure according to claim 7, wherein said flexible printed circuit board relief hole is formed at a position which is a middle point of a range of movement of said movable barrel.

9. The flexible printed circuit board housing structure according to claim 7, wherein said flexible printed circuit board housing space is provided with a spring mechanism for applying an urging force to urge said flexible printed circuit board into said flexible printed circuit board housing space.

10. The flexible printed circuit housing structure according to claim 9, wherein said spring means urges said flexible printed circuit board in a direction perpendicular to the optical axis of said camera.

11. The flexible printed circuit board housing structure according to claim 9, wherein said spring mechanism comprises a spring bearing pin, an end of said flexible printed circuit board is fixed to said flexible printed circuit board housing space, a slot, having a predetermined length, is formed lengthwise on a part of said flexible printed circuit board located inside said flexible printed circuit board housing space, and said spring bearing pin is movably fitted into said slot and said urging force is applied to said flexible printed circuit board via said spring bearing pin.

12. The flexible printed circuit board housing structure according to claim 7, wherein said film chamber is one of a cartridge chamber for storing unexposed film and a wind-up chamber for storing exposed film.

13. The flexible printed circuit board housing structure according to claim 9, said spring mechanism comprising a spring that is coupled to said flexible printed circuit board via an aperture in said flexible printed circuit board.

14. The flexible printed circuit board housing structure according to claim 9, said spring mechanism comprising a spring having a direction of elongation, said direction of elongation extending in a direction transverse to the optical axis.

15. A flexible printed circuit board housing structure for a camera, said camera including a film chamber, a stationary barrel, a movable barrel supported on the stationary barrel and adapted for movement in a direction of an optical axis of a lens of the camera, a flexible printed circuit board for electrically connecting an electrical unit on said movable barrel with a unit on said camera, said flexible printed circuit board housing structure comprising:

a flexible printed circuit board housing space, formed between said housing barrel and a substantially cylindrical wall face of said film chamber; and a spring mechanism, provided in said flexible printed circuit board housing space, that applies an urging force to urge said flexible printed circuit board into said flexible printed circuit board housing space, said spring mechanism applying an urging force to said flexible printed circuit board, said urging force urging said flexible printed circuit board in a direction away from an optical axis of a lens of the camera, said substantially cylindrical wall face of said film chamber comprising a guiding structure that guides a slack portion of said flexible printed circuit board in a direction away from the optical axis of a lens of the camera.

16. The flexible printed circuit board housing structure according to claim 15, wherein said spring mechanism urges said flexible printed circuit board in a direction perpendicular to the optical axis of said camera.

17. The flexible printed circuit board housing structure according to claim 15, said spring mechanism coupled to said flexible printed circuit board via an aperture in said flexible printed circuit board.

18. The flexible printed circuit board housing structure according to claim 15, said spring mechanism comprising a spring having a direction of elongation, said direction of elongation extending in a direction transverse to the optical axis.

19. A flexible printed circuit board housing structure for a camera, said camera including a film chamber, a stationary barrel, a movable barrel supported on the stationary barrel and adapted for movement in a direction of an optical axis of a lens of the camera, a flexible printed circuit board for electrically connecting an electrical unit on said movable barrel with a unit on said camera, said flexible printed circuit board housing structure comprising:

a flexible printed circuit board housing space, formed between said stationary barrel and a substantially cylindrical wall face of said film chamber; and a spring mechanism, provided in said flexible printed circuit board housing space, that applies an urging force to urge said flexible printed circuit board into said flexible printed circuit board housing space;

said spring mechanism comprises a spring and a spring bearing pin, said spring is fixed to said spring bearing pin and to the interior of said flexible printed circuit board housing space; and wherein a slot, having a predetermined length, is formed lengthwise on a part of said flexible printed circuit board located inside said flexible printed circuit board housing space, and said spring bearing pin being slidably fitted into said slot and said urging force is applied to said flexible printed circuit board via said spring bearing pin.

* * * * *